US012696669B2

(12) United States Patent
Lee et al.

(10) Patent No.: US 12,696,669 B2
(45) Date of Patent: Jul. 28, 2026

(54) DISPLAY APPARATUS INCLUDING MULTILAYER NEUTRAL PLANE COMPENSATION MEMBER

(71) Applicant: LG Display Co., Ltd., Seoul (KR)

(72) Inventors: Seonghyeon Lee, Busan (KR); Minwoo Jeon, Busan (KR); Jungmin Lee, Seoul (KR); Jonggun Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 833 days.

(21) Appl. No.: 17/954,115

(22) Filed: Sep. 27, 2022

(65) Prior Publication Data

US 2023/0139767 A1    May 4, 2023

(30) Foreign Application Priority Data

Oct. 28, 2021    (KR) ........................ 10-2021-0145399

(51) Int. Cl.
*H10K 59/80*        (2023.01)
*G02B 5/30*         (2006.01)
(Continued)

(52) U.S. Cl.
CPC ....... *H10K 59/8791* (2023.02); *G02B 5/3016* (2013.01); *H10K 50/844* (2023.02); *H10K 59/40* (2023.02); *H10K 77/111* (2023.02); *G06F 3/0412* (2013.01); *G06F 2203/04102* (2013.01); *H10K 2102/311* (2023.02)

(58) Field of Classification Search
CPC ...... H10K 50/86; H10K 50/844; H10K 50/84; H10K 50/8445; H10K 50/8426; H10K 50/868; H10K 59/40; H10K 59/8791; H10K 59/87; H10K 77/111; G02B 5/3016;
(Continued)

(56) References Cited

U.S. PATENT DOCUMENTS 7,005,671 B2    2/2006    Yamazaki et al.
7,492,095 B2    2/2009    Park et al.
(Continued)

FOREIGN PATENT DOCUMENTS

CN          101051154 A      10/2007
CN          101140334 A       3/2008
(Continued)

OTHER PUBLICATIONS

Nippon Zeon Co., Ltd., "Cyclo Olefin Polymer(COP) Zeonor," URL=http://www.dgpengxu.com/up_files/WX/ZEONOR.pdf, retrieved on Sep. 26, 2020. (9 pages).

*Primary Examiner* — Ida M Soward
(74) *Attorney, Agent, or Firm* — Seed Intellectual Property Law Group LLP

(57) ABSTRACT
A display apparatus includes a display panel part, a polarizing member, and a neutral plane compensation member disposed between the display panel part and the polarizing member. The neutral plane compensation member includes a first layer and a second layer, a thickness of the first layer being in a range of 20 μm to 60 μm, and a modulus of elasticity of the first layer being in a range of $1 \times 10^8$ Pa to $1 \times 10^{10}$ Pa, a thickness of the second layer being in a range of 20 μm to 60 μm, and a modulus of elasticity of the second layer being in a range of $1 \times 10^4$ Pa to $1 \times 10^6$ Pa.

20 Claims, 16 Drawing Sheets

(51) Int. Cl.

| | |
|---|---|
| *H10K 50/844* | (2023.01) |
| *H10K 59/40* | (2023.01) |
| *H10K 77/10* | (2023.01) |
| *G06F 3/041* | (2006.01) |
| *H10K 102/00* | (2023.01) |

(58) Field of Classification Search
CPC ............. G02B 5/3083; G02F 1/133305; G02F 3/0412; G02F 9/301
See application file for complete search history.

(56) References Cited

U.S. PATENT DOCUMENTS

| | | | |
|---|---|---|---|
| 7,782,423 | B2 | 8/2010 | Nakamura et al. |
| 8,698,981 | B2 | 4/2014 | Kameyama et al. |
| 9,029,846 | B2 | 5/2015 | Song et al. |
| 9,203,051 | B2 | 12/2015 | Byun et al. |
| 9,298,040 | B2 | 3/2016 | Choi et al. |
| 10,147,772 | B2 | 12/2018 | Breedlove et al. |
| 10,551,538 | B2 | 2/2020 | Lee |
| 10,910,454 | B2 | 2/2021 | Takechi et al. |
| 10,943,960 | B2 | 3/2021 | Lee et al. |
| 12,276,822 | B2 * | 4/2025 | Kishimoto ........... G02B 5/3033 |
| 2014/0367644 | A1 * | 12/2014 | Song .................. H10K 59/8722 |
| | | | 438/26 |
| 2015/0192481 | A1 | 7/2015 | Nguyen et al. |
| 2015/0201487 | A1 * | 7/2015 | Kee ................... G02F 1/133305 |
| | | | 361/749 |
| 2017/0135197 | A1 * | 5/2017 | Huitema .............. H05K 1/0271 |
| 2017/0147117 | A1 * | 5/2017 | Song .................... G06F 3/0443 |
| 2017/0194384 | A1 * | 7/2017 | Zhou ..................... H10K 59/40 |
| 2017/0213872 | A1 * | 7/2017 | Jinbo ..................... H10K 59/38 |
| 2018/0061893 | A1 | 3/2018 | Breedlove et al. |
| 2018/0145124 | A1 * | 5/2018 | Kim ..................... H10K 59/131 |
| 2018/0375043 | A1 | 12/2018 | Jung et al. |
| 2019/0004361 | A1 * | 1/2019 | Oka .................... G02F 1/13338 |
| 2019/0115547 | A1 * | 4/2019 | Lee ......................... B32B 27/32 |
| 2019/0193374 | A1 | 6/2019 | Yamasaki et al. |
| 2019/0312230 | A1 * | 10/2019 | Ochi ..................... H05B 33/12 |
| 2020/0006683 | A1 * | 1/2020 | Kim ..................... H10K 77/111 |
| 2020/0127229 | A1 * | 4/2020 | Noh ....................... H10K 59/87 |
| 2020/0365064 | A1 | 11/2020 | Cho et al. |
| 2021/0139747 | A1 | 5/2021 | Du et al. |
| 2022/0197440 | A1 * | 6/2022 | Son ...................... G06F 3/0418 |

FOREIGN PATENT DOCUMENTS

| | | | | |
|---|---|---|---|---|
| CN | 103913887 | A | 7/2014 | |
| CN | 104241316 | A | 12/2014 | |
| CN | 107547700 | A * | 1/2018 | .......... H05K 5/0086 |
| CN | 108121103 | A | 6/2018 | |
| CN | 113167932 | A | 7/2021 | |
| EP | 3089551 | A1 | 11/2016 | |
| JP | 2003115388 | A | 4/2003 | |
| JP | 2004354984 | A | 12/2004 | |
| JP | 2007182557 | A | 7/2007 | |
| JP | 2007279383 | A | 10/2007 | |
| JP | 2008197327 | A | 8/2008 | |
| JP | 2010152374 | A | 7/2010 | |
| JP | 2015103525 | A | 6/2015 | |
| JP | 2018028573 | A | 2/2018 | |
| JP | 2019191570 | A | 10/2019 | |
| JP | 2019528480 | A | 10/2019 | |
| JP | 2020009634 | A | 1/2020 | |
| JP | 2020505646 | A | 2/2020 | |
| JP | 2021075057 | A | 5/2021 | |
| JP | 2021135505 | A | 9/2021 | |
| JP | 2021140168 | A | 9/2021 | |
| KR | 20140092361 | A | 7/2014 | |
| KR | 10-1436441 | B1 | 9/2014 | |
| KR | 10-2015-0055793 | A | 5/2015 | |
| KR | 20160063964 | A * | 6/2016 | .......... H04M 1/0268 |
| KR | 10-2017-0079651 | A | 7/2017 | |
| KR | 20180025155 | A * | 3/2018 | .......... H10K 59/871 |
| KR | 20180047473 | A | 5/2018 | |
| KR | 20190005703 | A | 1/2019 | |
| KR | 10-2019-0017685 | A | 2/2019 | |
| KR | 10-2019-0030912 | A | 3/2019 | |
| KR | 20190044267 | A * | 4/2019 | ............. G09F 9/301 |
| KR | 20190060463 | A | 6/2019 | |
| KR | 20190064984 | A | 6/2019 | |
| KR | 10-2019-0138428 | A | 12/2019 | |
| KR | 10-2019-0139816 | A | 12/2019 | |
| KR | 20200025579 | A | 3/2020 | |
| KR | 20200104783 | A | 9/2020 | |
| KR | 20210055902 | A | 5/2021 | |
| WO | WO 2018180938 | A1 | 10/2018 | |
| WO | WO-2019107883 | A1 * | 6/2019 | ............. H10K 59/40 |
| WO | WO 2019131624 | A1 | 7/2019 | |
| WO | WO 2019208611 | A1 | 10/2019 | |
| WO | WO 2020241704 | A1 | 12/2020 | |

* cited by examiner

<u>1</u>

DISPLAY APPARATUS INCLUDING MULTILAYER NEUTRAL PLANE COMPENSATION MEMBER

CROSS-REFERENCE TO RELATED APPLICATION

This application claims priority from Korean Patent Application No. 10-2021-0145399 filed on Oct. 28, 2021 in the Korean Intellectual Property Office, the entirety of which is hereby incorporated by reference.

BACKGROUND

Technical Field

The present disclosure relates to a display apparatus, and more particularly, to a display apparatus capable of reducing defects that may occur due to stress applied to a polarizing member and a display panel of the display apparatus.

Description of the Related Art

Display apparatuses are implemented in a wide variety of types such as televisions, monitors, smart phones, tablet PCs, laptops, and wearable apparatuses.

Recently, various types of flexible display apparatuses such as a foldable display apparatus, a rollable display apparatus, and a stretchable display apparatus have been developed, thereby increasing portability thereof. However, the repeated folding and unfolding of flexible display apparatuses can lead to various issues, including cracking and separation or delamination of the components of the displays.

BRIEF SUMMARY

A flexible display apparatus refers to a display apparatus including a display panel having flexibility such that the display panel can be folded, rolled, or bent while maintaining display characteristics of a flat panel display apparatus.

For example, a foldable display apparatus may be folded to occupy a small area when carrying the apparatus, and may be unfolded in use thereof to use a wide display screen.

Therefore, a user of the foldable display apparatus repeats operations of folding and unfolding the foldable display apparatus many times.

The flexible display apparatus may be formed by stacking a plurality of layers having various functions and various properties, such as a cover window, a polarizing member, a display panel part, and a plate assembly, among others.

A flexible display apparatus may operate in a bendable or foldable scheme, such as an inner or inward folding scheme in which display surfaces face each other or a display panel part is disposed in an inner portion, or an outer or outward folding scheme in which non-display surfaces face each other or a display panel part is disposed in an outer portion.

When a conventional flexible display apparatus is folded, stress may be applied to the plurality of layers constituting the display apparatus.

Because the plurality of layers constituting the display apparatus have different physical properties and are disposed at different positions, magnitudes and types of stresses applied to the respective layers may be different from each other.

For example, when the flexible display apparatus is folded in an in-folding scheme, a strong tensile stress may be applied to a lower portion of the polarizing member of the apparatus, and a strong compressive stress may be applied to an upper portion of the display panel part of the apparatus.

The tensile stress and the compressive stress have forces of opposite directions. Thus, when a difference between the tensile stress and the compressive stress increases, the stress applied to the plurality of layers increases.

Accordingly, cracks may occur in the lower portion of the apparatus. In the upper portion of the apparatus, not only cracks but also a layer lift-off phenomenon or separation of the layers may occur. Thus, a likelihood of defects in the display apparatus may increase for flexible display devices compared to conventional display devices.

According to one or more embodiments of the disclosure, a display apparatus is provided that is capable of reducing the difference between the tensile stress and the compressive stress respectively applied to a polarizing member and a display panel part (which may also be referred to herein as a display panel), thereby reducing the stress applied to each of the polarizing member and the display panel part.

In one or more embodiments, a display apparatus is provided that is capable of reducing a difference between a stress applied to a polarizing member and a stress applied to a display panel part.

In one or more embodiments, a display apparatus is provided that is capable of reducing occurrence of a stain in a display panel due to a phase retardation.

In one or more embodiments, a display apparatus is provided that is capable of increasing a puncture strength.

In one or more embodiments, a flexible display apparatus is provided that is capable of operating in an in-folding scheme that may reduce occurrence of cracks in a polarizing member and occurrence of cracks in and a layer lift-off of the display panel.

A display apparatus according to an embodiment of the present disclosure includes a display panel part (or display panel), a polarizing member, and a neutral plane compensation member between the display panel part and the polarizing member.

The neutral plane compensation member includes a first layer and a second layer, wherein a thickness of the first layer is in a range from 20 $\mu$m to 60 $\mu$m, a modulus (or modulus of elasticity) of the first layer is in a range from $1.0 \times 10^8$ Pa to $1.0 \times 10^{10}$ Pa, and a thickness of the second layer is in a range from 20 $\mu$m to 60 $\mu$m, and a modulus of the second layer is in a range of $1.0 \times 10^4$ Pa to $1.0 \times 10^6$ Pa.

In one or more embodiments, a flexible display apparatus according to an embodiment of the present disclosure includes a display panel part, a polarizing member, and a neutral plane compensation member between the display panel part and the polarizing member, and may be bent or folded toward the display panel.

The neutral plane compensation member includes a first layer and a second layer, wherein a thickness of the first layer is in a range of 20 $\mu$m to 60 $\mu$m, a modulus of the first layer is in a range of $1.0 \times 10^8$ Pa to $1.0 \times 10^{10}$ Pa, a thickness of the second layer is in a range of 20 $\mu$m to 60 $\mu$m, and a modulus of the second layer is in a range of $1.0 \times 10^4$ Pa to $1.0 \times 10^6$ Pa.

According to an embodiment of the present disclosure, disposing the neutral plane compensation member including the first layer and the second layer between the polarizing member and the display panel part may allow a difference between the tensile stress and the compressive stress respectively applied to the polarizing member and the display panel part to be reduced, thereby reducing the stress applied to each of the polarizing member and the display panel part.

According to an embodiment of the present disclosure, the neutral plane compensation member disposed between the polarizing member and the display panel part has a phase retardation value smaller than or equal to a predefined value, thereby reduce the occurrence of the stain due to the phase retardation.

According to an embodiment of the present disclosure, the neutral plane compensation member having a predetermined thickness is disposed between the polarizing member and the display panel part, such that an overall thickness of the display apparatus may be increased, so that the puncture strength of the display apparatus may be increased.

According to an embodiment of the present disclosure, in the flexible display apparatus that may be bent or folded toward the display panel part, the tensile stress is applied to the lower portion of the polarizing member while the compressive stress is applied to the upper portion of the display panel part. In this regard, the difference between the compressive and tensile stresses may be reduced due to the neutral plane compensation member disposed between the polarizing member and the display panel part. Thus, the occurrence of cracks in the polarizing member and the occurrence of cracks in and a layer lift-off of the display panel part may be reduced.

Additional features and aspects will be set forth in the description that follows, and in part will be apparent from the description, or may be learned by practice of the concepts provided herein. Other features and aspects of the concepts may be realized and attained by the structure particularly pointed out in the written description, or derivable therefrom, and the claims hereof as well as the appended drawings.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain various principles of the disclosure. Throughout the drawings and the detailed description, unless otherwise described, the same drawing reference numerals should be understood to refer to the same elements, features, and structures. The relative size and depiction of these elements may be exaggerated for clarity, illustration, and convenience in some embodiments; however, the relative dimensions including the size and thickness of the components illustrated in the drawings are drawn to scale with respect to at least one actual working embodiment of the present disclosure.

DETAILED DESCRIPTION

Figure 1:
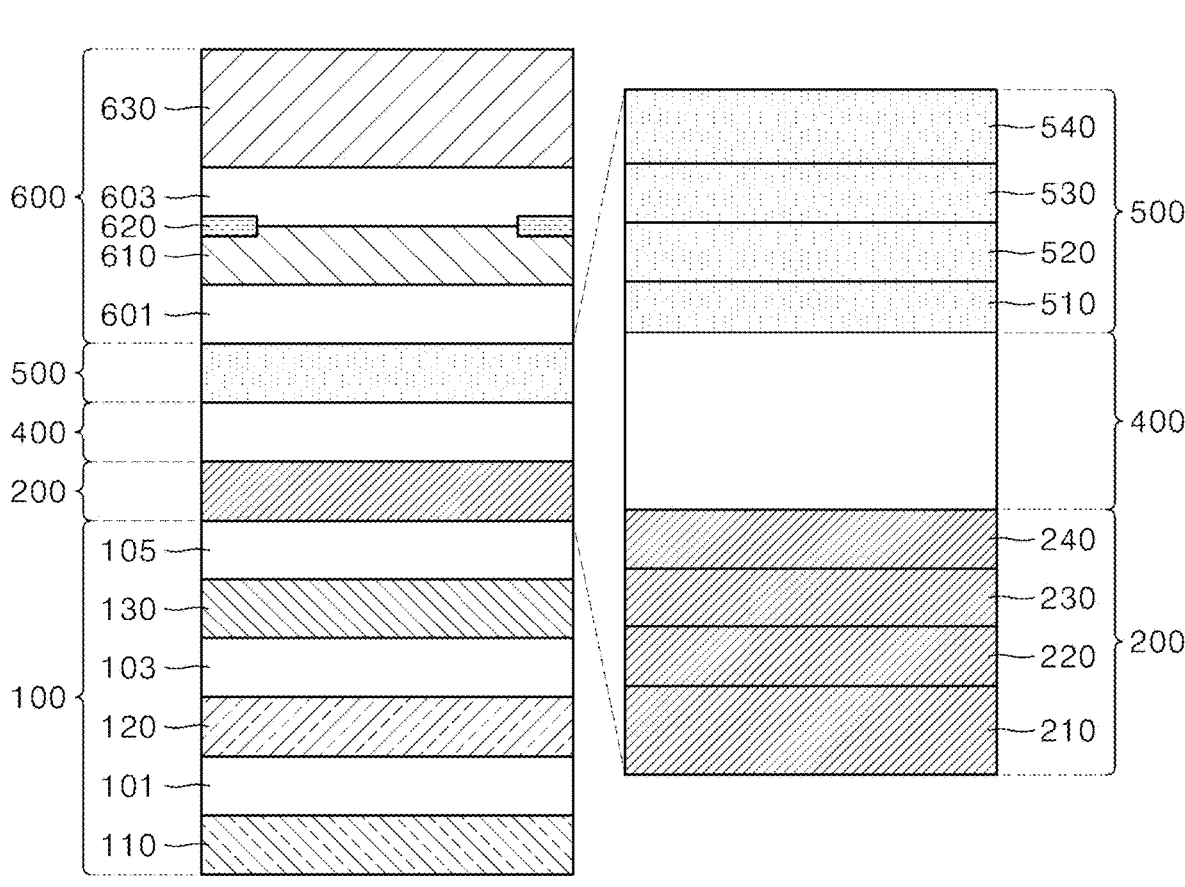
FIG. 1 is a cross-sectional view of a display apparatus according to an embodiment of the present disclosure and an enlarged cross-sectional view of a partial area thereof.

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

A shape, a size, a ratio, an angle, a number, etc., disclosed in the drawings for illustrating embodiments of the present disclosure are not necessarily to scale, and the present disclosure is not limited thereto. As used herein, the singular forms "a" and "an" are intended to include the plural forms as well, unless the context clearly indicates otherwise. It will be further understood that the terms "comprises," "comprising," "includes," and "including" when used in this specification, specify the presence of the stated features, integers, operations, elements, and/or components, but do not preclude the presence or addition of one or more other features, integers, operations, elements, components, and/or portions thereof.

In interpreting a numerical value, the value is interpreted as including an error range unless there is a separate explicit description thereof to the contrary.

It will be understood that when an element or layer is referred to as being "connected to," or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present. In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers.

In descriptions of temporal relationships, for example, temporal precedent relationships between two events such as "after," "subsequent to," "before," etc., another event may occur therebetween unless "directly after", "directly subsequent" or "directly before" is not indicated.

It will be understood that, although the terms "first," "second," "third," and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Hereinafter, embodiments of the present disclosure will be described in detail with reference to the accompanying drawings. For convenience of description, a scale of each of elements illustrated in the accompanying drawings differs from a real scale, and thus, is not limited to a scale illustrated in the drawings.

Hereinafter, various configurations of the display apparatus that may reduce a difference between the tensile stress and the compressive stress respectively applied to the polarizing member and the display panel part to reduce a stress applied thereto will be described in detail.

Figure 2:
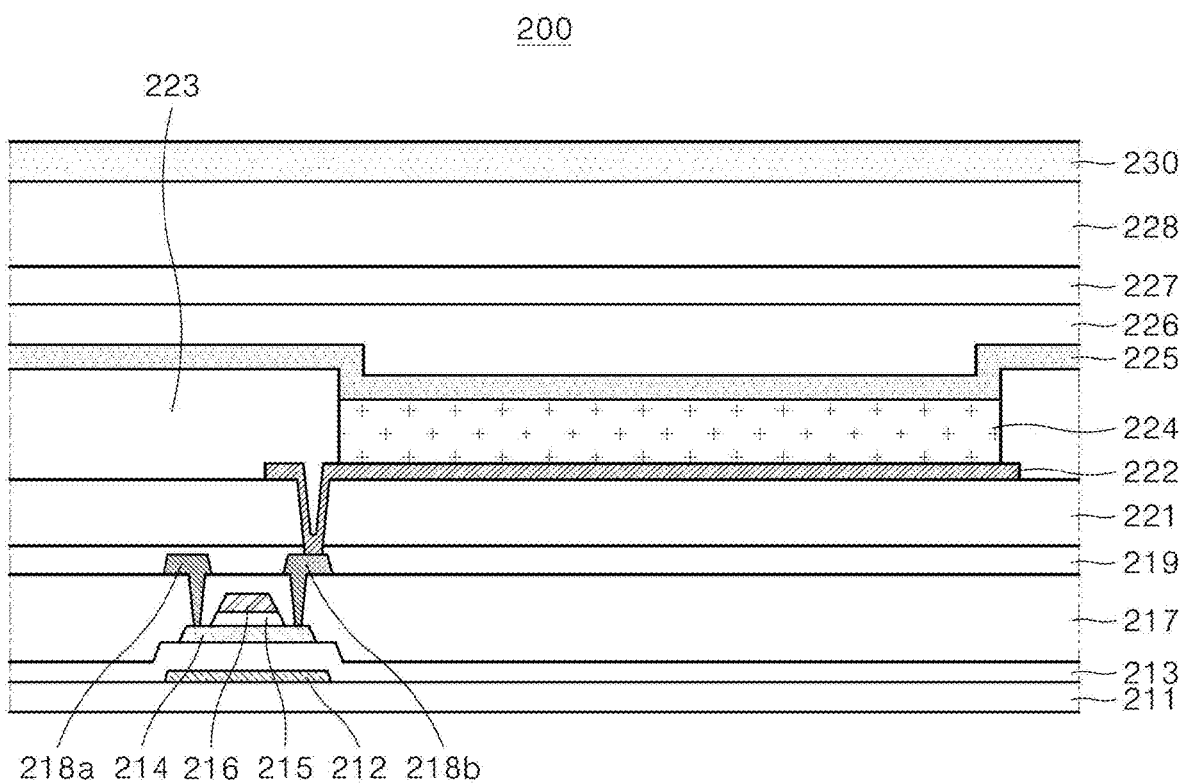
FIG. 2 is an enlarged cross-sectional view of a display panel part according to an embodiment of the present disclosure.

FIG. 1 is a cross-sectional view of a display apparatus according to an embodiment of the present disclosure and an enlarged cross-sectional view of a partial area thereof. FIG. 2 is an enlarged cross-sectional view of a display panel according to an embodiment of the present disclosure.

Referring to FIG. 1, a display apparatus 1 may include a plate assembly 100, a display panel part 200 (which may also be referred to herein as a display panel 200 or a display panel assembly 200), an adhesive part 400 (which may also be referred to herein as an adhesive layer 400), a polarizing member 500, and a cover window part 600 (which may also be referred to herein as a cover window 600).

The cover window part 600 may be disposed on the polarizing member 500 and the display panel part 200. The cover window part 600 may protect the polarizing member 500 and the display panel part 200 from damage caused by external shocks and scratches. In an embodiment, the cover window part 600 protects an upper surface of the polarizing member 500 and an upper surface of the display panel part 200.

The cover window part 600 may include a protective layer 610, a pattern layer 620, and a cover window 630 disposed on each other. In an embodiment, the protective layer 610 is closest to the polarizing member 500 and the cover window 630 is disposed furthest from the polarizing member 500 to form an external surface of the apparatus 1 with the pattern layer 620 between the protective layer 610 and the cover window 630.

The protective layer 610 may be a layer in which a pattern is formed that may be visible to a user even when the display panel 220 does not display an image. The protective layer 610 may be a decorative layer. Embodiments of the present disclosure are not limited thereto.

The pattern layer 620 may be disposed along an edge or an outer periphery of the protective layer 610.

For example, the pattern layer 620 may be disposed at an upper surface of the protective layer 610 and correspond to a bezel area or a non-display area of the display panel 220. Embodiments of the present disclosure are not limited thereto. For example, the pattern layer 620 may be disposed at a rear or bottom surface of the protective layer 610 opposite to the upper surface.

The pattern layer 620 may be a layer in which a decoration is printed or formed, and may be a decorative layer. Embodiments of the present disclosure are not limited to terms.

The pattern layer 620 may include an organic material such as black ink or carbon black, or an inorganic material such as a silicon oxide film ($SiO_2$), a silicon nitride film ($SiN_x$), and a metal, etc.

Further, the pattern layer 620 may include a black matrix.

When the pattern layer 620 is present, and even when the display panel part 200 does not display an image, the bezel area of the display panel part 200 may be displayed in substantially the same color as that of the display area of the display panel part 200. Thus, the user may see the screen of the display panel part 200 in a wider manner.

The cover window 630 may be disposed on the protective layer 610 and the pattern layer 620.

The cover window 630 may protect the protective layer 610, the pattern layer 620, the polarizing member 500, and the display panel part 200 under the cover window 630 from external impact, moisture, heat, and the like.

Accordingly, the cover window 630 may be composed of a glass or plastic film having impact resistance and light transmittance.

When the cover window 630 is formed of glass, a protective film including polyethylene terephthalate (PET) may be further disposed at one surface of the cover window 630, such as a top or bottom surface in an embodiment, to prevent scattering of fragments that may occur when the cover window 630 is broken by external force or stress.

Further, when the cover window 630 is composed of the plastic film, the plastic film may be an acrylic film, a transparent polyimide (colorless polyimide film), or the like.

A hard coating layer is disposed on the cover window 630 and is configured to protect the cover window 630 from external impact.

The hard coating layer may include a transparent organic/inorganic composite material, thereby effectively protecting the cover window 630 and reducing deterioration of light transmittance.

The plate assembly 100 may be disposed under the display panel part 200. The plate assembly 100 protects the display panel part 200 from external moisture, heat, and shock, and may dissipate heat generated from the display panel part 200 to an outside. In an embodiment, the plate assembly 100 protects a bottom surface or side surfaces, or both, of the display panel part 200.

The plate assembly 100 may act as a frame having impact resistance to protect the display panel part 200.

The plate assembly 100 may include a lower plate 110, and an upper plate 120.

The upper plate 120 may be disposed on the lower plate 110.

Each of the lower plate 110 and the upper plate 120 may include a metal material with high thermal conductivity and excellent charge transfer.

A support layer 130 may be disposed on the upper plate 120.

The support layer 130 may be disposed at a rear or bottom surface of the display panel part 200, and may protect the display panel part 200 from external moisture, heat, and impact or the like.

The support layer 130 may act as a back plate that supports the rear or bottom surface of the display panel part 200. The support layer 130 may be composed of a polyethylene terephthalate (PET) film or a metal thin-film. Embodiments of the present disclosure are not limited thereto.

The plate assembly 100 and the cover window part 600 as described above may include first to fifth adhesive layers 101, 103, 105, 601, and 603 that may fix or attach adjacent layers to each other, but the same is not necessarily required. In an embodiment, one or more of the layers of the plate assembly 100 and the cover window part 600 are coated directly on each other without an intervening adhesive layer.

For example, the first adhesive layer 101 may be disposed between the lower plate 110 and the upper plate 120 and configured to fix or attach the lower plate 110 and the upper late 120 to each other, the second adhesive layer 103 may be disposed between the upper plate 120 and the support layer 130 and configured to fix or attach the upper plate 120 and the support layer 130 to each other, and the third adhesive layer 105 may be disposed between the support layer 130 and the display panel part 200 and configured to fix or attach the support layer 130 and the display panel part 200 to each other.

Further, the fourth adhesive layer 601 may be disposed between the polarizing member 500 and the protective layer 610 and configured to fix or attach the polarizing member 500 and the protective layer 610 to each other, and the fifth adhesive layer 603 may be disposed between the protective layer 610 and the cover window 630 and configured to fix or attach the protective layer 610 and the cover window 630 to each other.

Each of the first to fifth adhesive layers 101, 103, 105, 601, and 603 may be formed of a material having high adhesive force and/or high transparency.

Each of the first to fifth adhesive layers 101, 103, 105, 601, and 603 in accordance with the present disclosure may include a layer having an adhesive function as well as adhesion (or stickiness) function.

Each of the first to fifth adhesive layers 101, 103, 105, 601, and 603 may be formed between adjacent layers and may have an adhesive force so that bubbles or peeling do not occur even when a bending or a curvature thereof occurs, and may have viscoelastic properties used for the display apparatus 1.

Each of the first to fifth adhesive layers 101, 103, 105, 601, and 603 may include an acrylic-based composition or a silicone-based composition. For example, each of the first to fifth adhesive layer 101, 103, 105, 601, and 603 may include an optical clear adhesive (OCA) composition or a pressure sensitive adhesive (PSA) composition.

The display panel part 200, the adhesive part 400, and the polarizing member 500 may be disposed between the plate assembly 100 and the cover window part 600.

The display panel part 200 may be disposed on the plate assembly 100.

The display panel part 200 is shown in more detail in the detailed view of FIG. 1 and may include an array part 210 (which may also be referred to herein as an array 210), a pixel part 220 (which may be also be referred to herein as a pixel 220), a sealing layer 230, and a touch electrode layer 240 stacked on each other in sequential order in an embodiment.

The display panel part 200 may generate an image to be displayed. A type of the display panel part 200 is not limited. However, the display panel part may include an organic light-emitting display panel, a micro light-emitting diode display panel, etc., which are advantageous for realizing a flexible display apparatus.

The array part 210 may include a plurality of signal lines configured to supply various signals to a plurality of pixels, a switching thin-film transistor, and a driving thin-film transistor.

The signal lines may include a gate line, a data line, a pixel driving power line, and the like.

The detail view of FIG. 1 also provides additional detail of the polarizing member 500. The polarizing member 500 may be disposed on the display panel part 200.

The adhesive part 400 may be disposed between the display panel part 200 and the polarizing member 500 to fix the polarizing member 500 to the display panel part 200.

The adhesive part 400 may be formed of the same material as that of each of the first to fifth adhesive layers 101, 103, 105, 601, and 603 as described above.

The display panel part 200 may include various metal materials used for the thin-film transistors, the signal lines, the electrodes, and the light-emitting element layer.

External light incident on the display panel part 200 may be reflected from the above metal material. Visibility of the display apparatus 1 may be deteriorated due to reflection of external light.

Accordingly, the polarizing member 500 includes a retardation film (or phase retardation film) that selectively transmits light therethrough to reduce reflection of external light incident on the display panel part 200, thereby improving outdoor visibility of the display apparatus 1.

The polarizing member 500 may refer to an optical part that receives unpolarized light in which polarized states are mixed with each other in disorder and selectively transmits therethrough light linearly polarized in a specific direction.

As shown in the detail view of FIG. 1, the polarizing member 500 may include a compensation film layer 510, a retardation film layer (or a phase retardation film layer) 520, a polarizing film layer 530, and a base layer 540.

The polarizing film layer 530 may act as a polarizer capable of absorbing light linearly polarized in parallel to an absorption axis and transmitting therethrough light linearly polarized in perpendicular to the absorption axis, that is, light linearly polarized in parallel to a transmission axis.

The polarizing film layer 530 may be formed of polyvinyl alcohol (PVA) which is dyed with iodine ions or dichroic dyes and thus is elongated.

The base layer 540 may be disposed on the polarizing film layer 530.

The base layer 540 may be a protective film that protects the polarizing film layer 530 from external moisture.

A surface treatment for anti-reflection, anti-glare, and/or surface reinforcement may be performed or applied on the base layer 540.

The base layer 540 may be formed of triacetyl cellulose, a cyclic olefin polymer, a polycarbonate, an acryl, or a polyethylene terephthalate. Embodiments of the present disclosure are not limited thereto.

The retardation film layer 520 may be disposed under the polarizing film layer 530.

In accordance with an embodiment of the present disclosure, "under the polarizing film layer 530" may mean that the display panel part 200 is disposed under the polarizing film layer 530. In one or more embodiments, "under the polarizing film layer 530" may mean that the retardation film layer 520 is directly below, and disposed directly on, the polarizing film layer 530 in sequential order as shown in the detail view of FIG. 1.

According to an embodiment of the present disclosure, the polarizing film layer 530 may be a quarter-wavelength plate (QWP or λ/4 plate).

Since the quarter-wavelength plate has a phase retardation of a wavelength (λ) of light of λ/4, a polarizing direction of incident light thereon may be changed.

Accordingly, linearly polarized light passing through the quarter-wavelength plate may be converted into circularly polarized light. Circularly polarized light passing through the quarter-wavelength plate may be converted into linearly polarized light.

For example, the quarter-wavelength plate may have various wavelength dispersion characteristics such as reverse wavelength dispersion, flat wavelength dispersion, and forward wavelength dispersion.

According to an embodiment of the present disclosure, the polarizing film layer 530 may be a quarter-wavelength plate rQWP having reversed wavelength dispersion.

A retardation value required to achieve circular polarization of light may vary based on a wavelength of the light.

In this regard, the quarter-wavelength plate rQWP with the reverse wavelength dispersion may achieve a phase retardation so that light is closer to circularly polarized light, in comparison with a quarter-wavelength plate having forward wavelength dispersion or flat wavelength dispersion.

The retardation film layer 520 may include liquid crystals aligned in one direction.

For example, the liquid crystal may be a nematic liquid crystal or a smectic liquid crystal.

Further, the retardation film layer 520 may be formed to be aligned in one direction by coating a mixture of liquid crystals and dichroic dye and applying photo-alignment to the mixture.

For example, the retardation film layer 520 may be formed by forming an alignment film on a substrate, mixing the liquid crystals and the dichroic dye, coating the mixture on the alignment film, and aligning the mixture using polarizing ultraviolet (UV).

The compensation film layer 510 may be disposed under the retardation film layer 520.

The compensation film layer 510 may block reflection of external light not only in a frontward direction but also in a lateral direction, thereby reducing reflectance of external light due to a viewing angle.

According to an embodiment of the present disclosure, the compensation film layer 510 may be a +C plate (positive C plate).

The +C plate may have a refractive index relationship in different directions characterized by the equation nx=ny<nz where nx is a refractive index in an x direction, ny is a refractive index in a y direction, and nz is a refractive index in a z direction.

The compensation film layer 510 may include liquid crystals aligned in one direction.

For example, the liquid crystal may be a nematic liquid crystal or a smectic liquid crystal.

Further, the compensation film layer 510 may be formed to be aligned in one direction by coating a mixture of liquid crystals and dichroic dye and applying photo-alignment to the mixture.

For example, the compensation film layer 510 may be formed by forming an alignment film on a substrate, mixing the liquid crystals and the dichroic dye, coating the mixture on the alignment film, and aligning the mixture using polarizing ultraviolet (UV).

The display apparatus 1 according to an embodiment of the present disclosure includes the display panel part 200 and the polarizing member 500. The adhesive portion 400 may be disposed between the display panel part 200 and the polarizing member 500 to fix or attach the polarizing member 500 to the display panel part 200.

The polarizing member 500 may be laminated to the display panel 200 by the adhesive part 400.

The base layer 540, the polarizing film layer 530, the retardation film layer 520, and the compensation film layer 510 of the polarizing member 500 may be sequentially stacked in a direction toward the display panel part 200.

Accordingly, the retardation film layer 520 and the compensation film layer 510 may constitute a lower portion of the polarizing member 500 with respect to an entire stack of the polarizing member 500.

Each of the phase retardation film layer 520 and the compensation film layer 510 of the polarizing member 500 may include liquid crystals aligned in one direction.

Since the liquid crystal is vulnerable to stress, the layers relatively vulnerable to the stress may constitute the lower portion of the polarizing member 500.

The display panel part 200 may include an array part 210, a pixel part 220, and a sealing layer (or an encapsulation layer) 230. The array part 210, the pixel part 220, and the sealing layer 230 may be sequentially stacked in a direction toward the polarizing member 500.

With reference to FIG. 1 and FIG. 2, and as explained in more detail below, the pixel part 220 may include an anode electrode 222, a light-emitting element layer 224, and a cathode electrode 225. The anode electrode 222, the light-emitting element layer 224, and the cathode electrode 225 may be sequentially stacked in a direction toward the polarizing member 500.

Accordingly, the cathode electrode 225 and the sealing layer 230 may constitute an upper portion of the display panel part 200 with respect to an entire stack of the display panel part 200.

A planarization layer 226 including an organic material and a second passivation layer 227 including an inorganic material may be disposed between the cathode electrode 225 (FIG. 2) and the sealing layer 230.

Further, the sealing layer 230 may include an inorganic, an organic, or an organic and an inorganic composite layer to prevent penetration of external moisture and oxygen.

An upper portion of the display panel part 200 composed of the cathode electrode 225 (FIG. 2) and the sealing layer 230 may include a stack of the organic material layers and the inorganic material layers, and thus may be vulnerable to stress.

Accordingly, layers that are relatively vulnerable to stress constitute the upper portion of the display panel part 200 in an embodiment.

When the display apparatus 1 is a flexible display apparatus, greater stress may be applied to the lower portion of the polarizing member 500 and the upper portion of the display panel part 200 while the adhesive part 400 is interposed therebetween.

FIG. 2 is a cross-sectional view providing additional detail of the display panel part 200. Referring to FIG. 2, with continuing reference to FIG. 1, a buffer layer 213 may be formed on a base substrate 211, and a switching thin-film transistor including an active layer 214, a gate electrode 216, a first electrode 218a, and a second electrode 218b may be disposed on the buffer layer 213.

A light-blocking layer 212 configured to prevent light from being incident on the active layer 214 of the switching thin-film transistor may be disposed between the base substrate 211 and the buffer layer 213.

A gate insulating layer 215 capable of insulating the active layer 214 and the gate electrode 216 from each other may be disposed between the active layer 214 and the gate electrode 216.

An interlayer insulating layer 217 may be disposed on the active layer 214 and the gate electrode 216. The first electrode 218a and the second electrode 218b may be electrically connected to the active layer 214 via contact holes formed in the interlayer insulating layer 217, respectively.

The first electrode 218a may be a source electrode, and the second electrode 218b may be a drain electrode.

The pixel part 220 may include a plurality of pixel areas configured by the signal lines.

A plurality of pixels configured to display an image according to signals supplied to the signal lines may be disposed in the pixel areas, respectively.

Each of the plurality of pixels may include a switching thin-film transistor in a pixel area, an anode electrode 222 electrically connected to the switching thin-film transistor, a light-emitting element layer 224 formed on the anode electrode 222, and a cathode electrode 225 electrically connected to the light-emitting element layer 224.

A first passivation layer 219 and an overcoat layer 221 may be disposed between the switching thin-film transistor and the anode electrode 222.

The first passivation layer 219 may be formed of an inorganic material. The overcoat layer 221 may be formed of an organic material.

The anode electrode 222 may be electrically connected to the second electrode 218b of the switching thin-film transistor via a contact hole formed in the first passivation layer 219 and the overcoat layer 221.

The light-emitting element layer 224 may include, for example, an organic light-emitting element formed on the anode electrode 222.

The organic light-emitting element may be implemented to emit light of the same color for the pixels, such as white light, or to emit light of different colors for different pixels, such as red, green, or blue light.

In another embodiment of the present disclosure, the organic light-emitting element may be composed of a first element layer in which red, green, and blue light emit from pixels, and a second element layer which is disposed on the first element layer and in which red, green, and blue light emit from pixels. A charge generation layer may be disposed between the first element layer and the second element layer. The charge generation layer may include an N-type charge generation layer and a P-type charge generation layer.

In another example, the light-emitting element layer 224 may include a micro light-emitting diode element electrically connected to each of the anode electrode and the cathode electrode.

The micro light-emitting diode element refers to a light-emitting diode implemented in a form of an integrated circuit (IC) or a chip, and may include a first terminal electrically connected to the anode electrode and a second terminal electrically connected to the cathode electrode.

The bank layer 223 is disposed at a boundary between the respective light-emitting element layers 224 to reduce color mixing between the light-emitting element layers 224 displaying different colors.

A planarization layer 226 and a second passivation layer 227 may be disposed on the cathode electrode 225.

The planarization layer 226 may be formed of an organic material, and the second passivation layer 227 may be formed of an inorganic material.

A sealing layer (or an encapsulation layer) 230 may be disposed on the second passivation layer 227 to prevent moisture or foreign substances from penetrating into the light-emitting element layer 224. The sealing layer 230 may secured thereto via an adhesive layer 228.

A touch electrode layer 240 (FIG. 1) may be disposed on the sealing layer 230.

The touch electrode layer 240 may have a ToE (Touch Sensor on Encapsulation) structure in which a touch electrode and a touch line are disposed on the sealing layer 230 of the display panel part 200. Embodiments of the present disclosure are not limited thereto.

The touch electrode layer 240 may detect a user's touch input such as presence or absence of screen touch or touch coordinates, and may detect an input signal from a touch of a user or a tool through the cover window part 600.

The touch electrode layer 240 may be implemented in various schemes, such as a resistive film scheme, a capacitive scheme, an optical scheme, or an electromagnetic scheme. However, embodiments of the present disclosure are not particularly limited.

The touch electrode layer 240 may include a touch sensor structure including a plurality of touch electrodes and a plurality of touch routing lines for connecting the touch electrodes to a touch sensing circuit.

Figure 3:
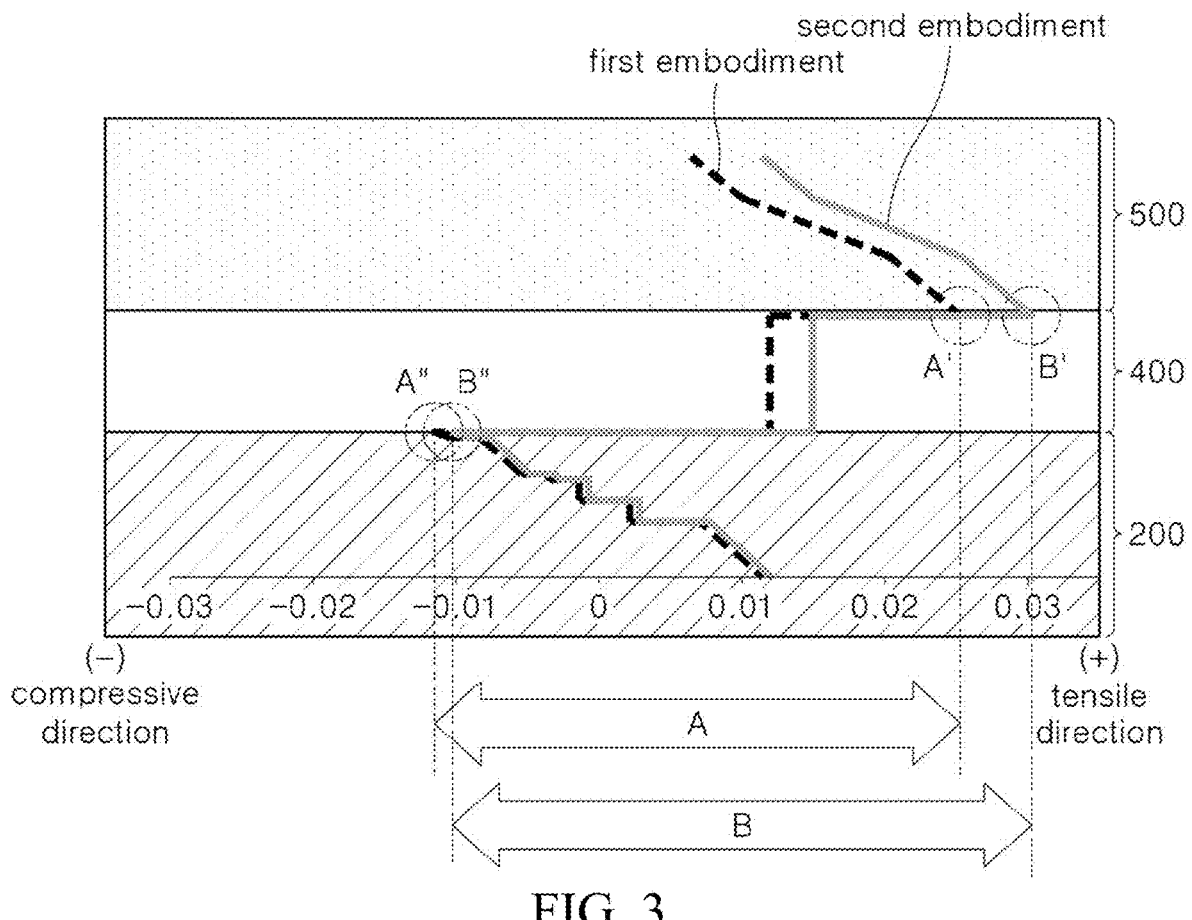
FIG. 3 illustrates a difference between stresses applied to a polarizing member, an adhesive portion, and a display panel part of a display apparatus according to each of a first embodiment and a second embodiment of the present disclosure.

FIG. 3 illustrates a difference between the stresses applied to the display panel part 200, the polarizing member 500, and the adhesive part 400 of the display apparatus according to each of a first embodiment and a second embodiment of the display apparatus 1 when the display apparatus 1 is folded in an inner folding scheme in which display surfaces of the display panel part 200 face each other or the display panel part 200 is disposed in an inner portion or configuration.

The first embodiment and the second embodiment of the display apparatus 1 have different thicknesses of the cover window 630. Conditions of the other components thereof are substantially the same as each other.

A thickness w1 of the cover window 630 according to a first embodiment of the display apparatus 1 is 60 μm, and a thickness w2 of the cover window 630 according to a second embodiment of the display apparatus 1 is 90 μm.

Based on change in a thickness of the cover window 630, a magnitude of a stress applied to each of the polarizing member 500 and the display panel part 200 may vary.

The polarizing member 500 has a relatively high modulus of elasticity and is disposed above the adhesive part 400. Thus, when the thickness of the cover window 630 increases, greater tensile stress may be applied to the polarizing member 500.

Further, the display panel part 200 has a relatively high modulus of elasticity and is disposed under the adhesive part 400. Thus, greater compressive stress may be applied to the display panel part when the thickness of the cover window 630 increases.

The adhesive part 400 disposed between the polarizing member 500 and the display panel part 200 has a relatively low modulus of elasticity, and thus may serve to reduce the compressive stress applied to the display panel part 200 and the tensile stress applied to the polarizing member 500.

It may be identified that in the first embodiment of the display apparatus 1, a difference A between a magnitude of the tensile stress A' applied to the polarizing member 500 and a magnitude of the compressive stress A" applied to the display panel part 200 is quite large.

Referring to FIG. 3, it may be identified that in the first embodiment of the display apparatus 1, the magnitude of the tensile stress A' applied to the polarizing member 500 increases by a ratio of about 0.025 in a (+) tensile direction. It may be identified that in the first embodiment of the display apparatus 1, the magnitude of the compressive stress A" applied to the display panel part 200 increases by a ratio of about 0.012 in a (−) compressive direction.

Therefore, it may be identified that in the first embodiment of the display apparatus 1, the difference A between the magnitude of the tensile stress A' applied to the polarizing member 500 and the magnitude of the compressive stress A" applied to the display panel part 200 has a ratio of about 0.037.

Further, it may be identified that in the second embodiment of the display apparatus 1, a difference B between the magnitude of the tensile stress B' applied to the polarizing member 500 and the magnitude of the compressive stress B" applied to the display panel part 200 is quite large.

Referring to FIG. 3, it may be identified that in the second embodiment of the display apparatus 1, the magnitude of the tensile stress B' applied to the polarizing member 500 increases by a ratio of about 0.03 in the (+) tensile direction. It may be identified that in the second embodiment of the display apparatus 1, the magnitude of the compressive stress B" applied to the display panel part 200 increases by a ratio of about 0.01 in the (−) compressive direction.

Therefore, it may be identified that, in the second embodiment of the display apparatus 1, the difference B between the magnitude of the tensile stress B' applied to the polarizing member 500 and the magnitude of the compressive stress B" applied to the display panel part 200 has a ratio of about 0.04.

When the tensile stress is applied to the lower portion of the polarizing member 500, cracks may occur frequently in the lower portion of the polarizing member 500.

Figure 4A:
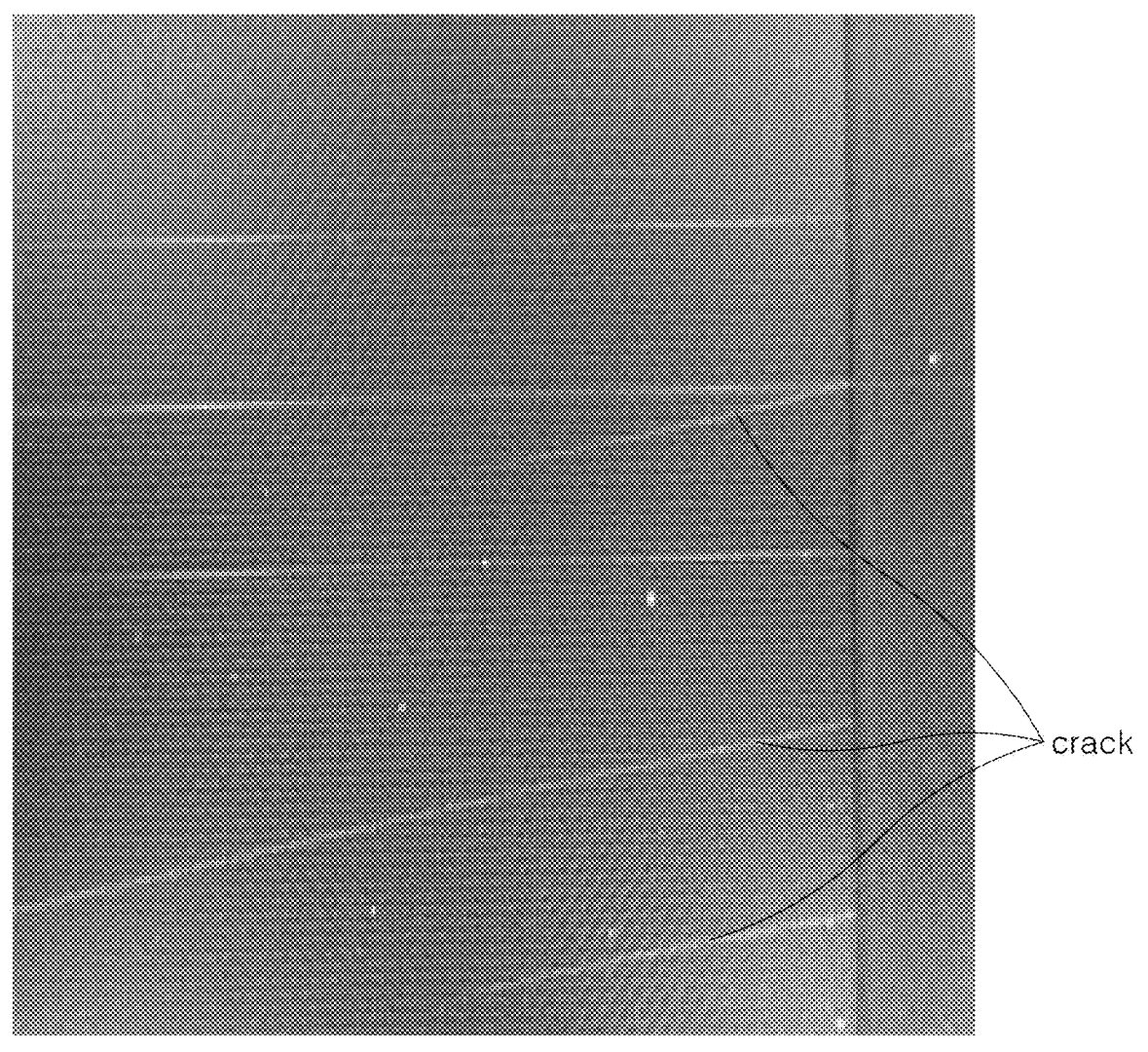
FIG. 4A is a photograph showing cracks in a liquid crystal layer of a polarizing member that may occur according to each of the first embodiment and the second embodiment of the present disclosure.

FIG. 4A illustrates a crack phenomenon occurring in a layer including the liquid crystal of the polarizing member 500.

Referring to FIG. 4A, it may be identified that a plurality of cracks are generated in an oblique direction in the polarizing member 500 in which a plurality of layers are stacked.

Further, when the compressive stress is applied to the upper portion of the display panel part 200, cracks or layer lift-off (or lifting or separation) of the layers may occur frequently in the upper portion of the display panel part 200.

Figure 4B:
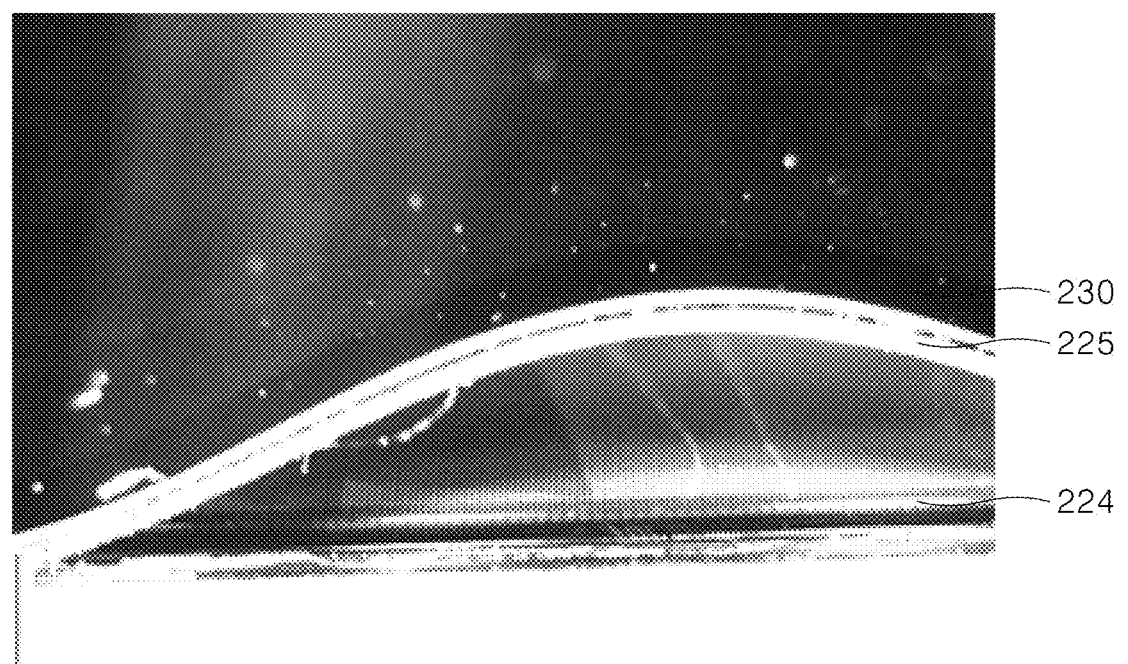
FIG. 4B is a photograph showing a lift-off phenomenon of a cathode electrode of a display panel part that may occur according to each of the first embodiment and the second embodiment of the present disclosure.

FIG. 4B illustrates a lift-off phenomenon in which the cathode electrode 225 of the display panel part 200 is lifted off.

Referring to FIG. 4B, it may be identified that the cathode electrode 225 and the sealing layer 230 disposed on the light-emitting element layer 224 of the display panel part 200 are lifted off from the light-emitting element layer 224.

The crack phenomenon in the lower portion of the polarizing member 500 or the lift-off phenomenon of the layer in the upper portion of the display panel part 200 may vary depending on a thickness distribution of each of the layers of the display apparatus.

For example, in the first embodiment of the display apparatus 1 with the relatively smaller thickness of the cover window 630, the lift-off phenomenon of the cathode electrode 225 in the display panel part 200 may occur. In the second embodiment of the present disclosure having the relatively larger thickness of the cover window 630, the cracks may occur in the retardation film layer 520 or the compensation film layer 510 of the polarizing member 500.

Hereinafter, a display apparatus 2 according to one or more embodiments of the present disclosure is described that may reduce the difference between the tensile stress and the compressive stress respectively applied to the polarizing member 500 and the display panel part 200 to reduce the overall stress applied to the polarizing member 500 and the display panel part 200.

Figure 5A:
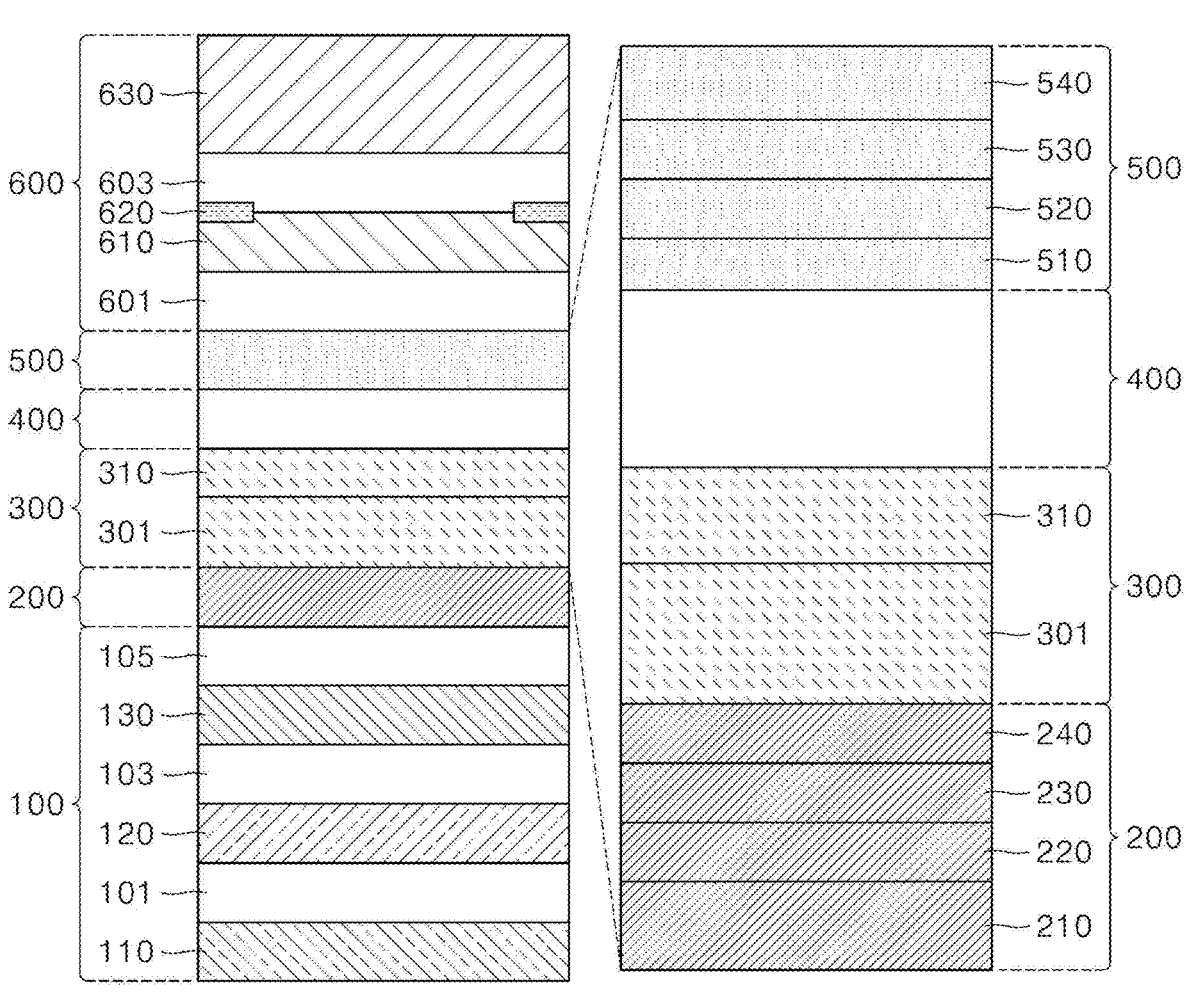
FIG. 5A is a cross-sectional view of a display apparatus according to a third embodiment of the present disclosure and an enlarged cross-sectional view of a partial area thereof.

FIG. 5A is a cross-sectional view of a display apparatus 2 according to one or more embodiments of the present disclosure and an enlarged cross-sectional view of a partial area of the display apparatus 2.

The display apparatus 2 may have the same configuration as that of the display apparatus 1 described with reference to FIG. 1 to FIG. 4B except as otherwise described herein, and particularly with respect to a neutral plane compensation member 300 disposed between the display panel part 200 and the adhesive part 400 for the polarizing member 500 in the display apparatus 2.

Therefore, embodiments of display apparatus 2 of the present disclosure will be described with a particular emphasis on the neutral plane compensation member 300, and the descriptions duplicate with those of the display apparatus 1 will be omitted.

A neutral plane compensation member 300 may be disposed between the display panel part 200 and the polarizing member 500.

Further, the adhesive part 400 may be disposed between the polarizing member 500 and the neutral plane compensation member 300. Thus, the display apparatus 2 may include the plate assembly 100, the display panel part 200, the neutral plane compensation member 300, the adhesive part 400, the polarizing member 500, and the cover window part 600 stacked in sequential order.

The neutral plane compensation member 300 may include a first layer 310 and a second layer 301. For example, the first layer 310 may act as a neutral plane compensation layer. However, embodiments of the present disclosure are not limited thereto. For example, the second layer 301 may act as a fixing layer or an adhesive layer. Embodiments of the present disclosure are not limited thereto.

The first layer 310 of the neutral plane compensation member 300 may be disposed at a lower portion the adhesive part 400 and may contact the adhesive part 400. In other words, the first layer 310 of the neutral plane compensation member 300 may be disposed directly on the adhesive part 400, such as being disposed on a lower portion or bottom surface of the adhesive part 400 in the orientation shown in FIG. 5A.

The second layer 301 of the neutral plane compensation member 300 may be disposed above the display panel part 200 and contact the display panel part 200. In an embodiment, the second layer 301 is disposed directly on the display panel part 200, such as being disposed on an upper portion or top surface of the display panel part 200 in the orientation shown in FIG. 5A. In one or more embodiments, the first and second layers 310, 301 have an inverse orientation, namely, the second layer 301 is disposed on the adhesive part 400 and the first layer 310 is disposed on the display panel part 200.

The first layer 310 may be a tri-acetyl cellulose (TAC) film.

The second layer 301 may include an acrylic composition or a silicone-based composition. For example, the second layer 301 may include an optical clear adhesive (OCA) composition or a pressure sensitive adhesive (PSA) composition.

The neutral plane compensation member 300 may be disposed between the polarizing member 500 to which strong tensile stress is applied and the display panel part 200 to which strong compressive stress is applied, and thus may serve as a compensation layer to reduce the difference between the stresses applied thereto.

Figure 5B:
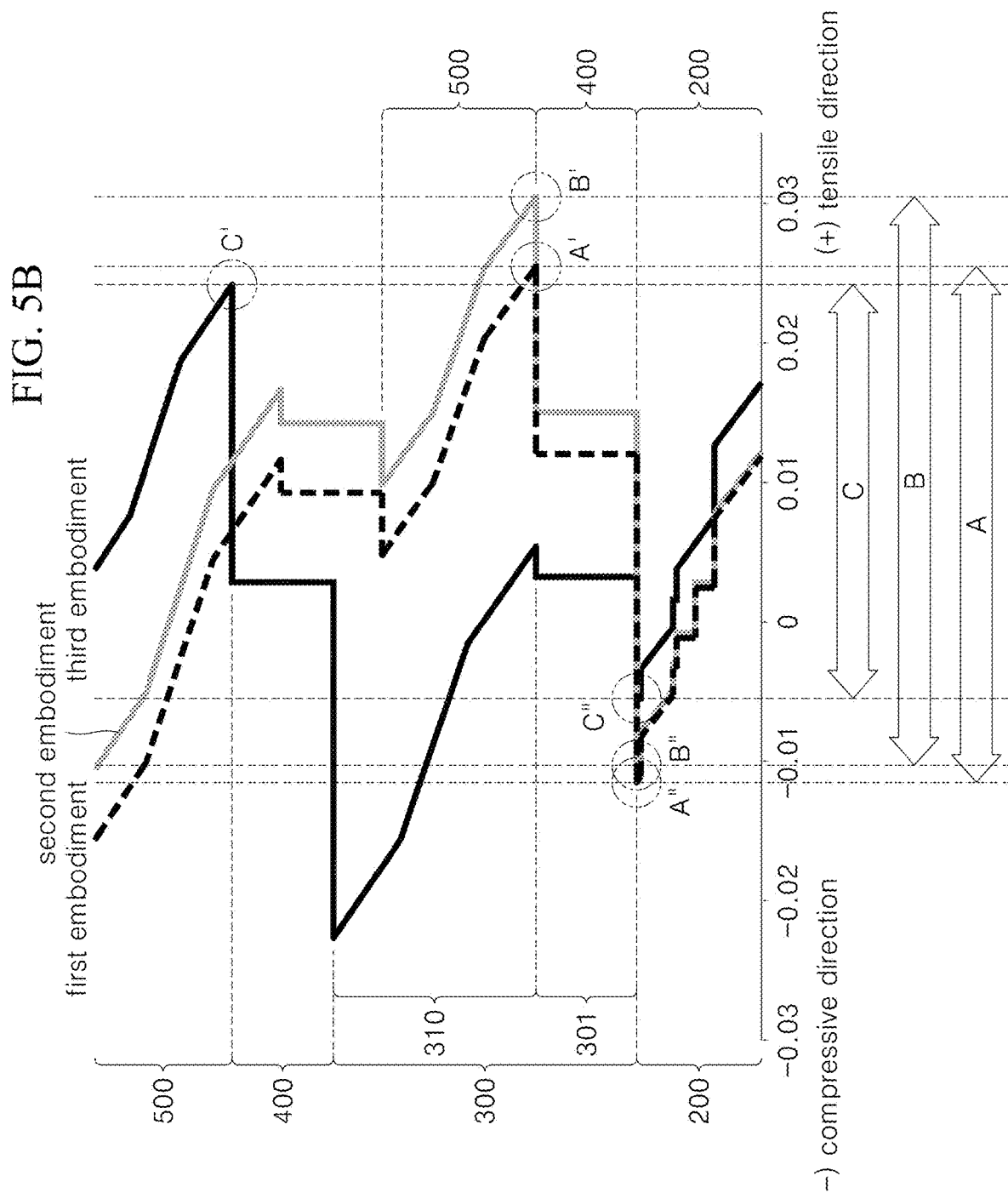
FIG. 5B illustrates a difference between stresses applied to a polarizing member, an adhesive portion, and a display panel part according to each of the first embodiment, and the second embodiment of the present disclosure, and a difference between stresses applied to a polarizing member, an adhesive portion, a neutral plane compensation member and a display panel part according to the third embodiment of the present disclosure.

FIG. 5B illustrates a difference between stresses applied to the polarizing member 500, the adhesive part 400, and the display panel part 200 stacked according to the first embodiment and the second embodiment of the display apparatus 1 described with reference to FIG. 3, and a difference between stresses applied to the polarizing member 500, the adhesive part 400, the neutral plane compensation member 300, and the display panel part 200 stacked according to embodiments of the display apparatus 2 of the present disclosure in FIG. 5A.

In the example of the display apparatus 2 represented in FIG. 5B, a thickness of the neutral plane compensation member 300 is selected to be 60 μm, and a thickness of the adhesive part 400 is selected to be 50 μm. However, embodiments of the disclosure are not limited thereto and the thicknesses may be selected to be more or less than these values.

As described with reference to FIG. 3, in the first embodiment and the second embodiment of the display apparatus 1, the polarizing member 500 and the display panel part 200 may be disposed or bonded to each other by the adhesive part 400 interposed therebetween.

A lower portion of the polarizing member 500 composed of the retardation film layer 520 and the compensation film layer 510, and an upper portion of the display panel part 200 composed of the cathode electrode 225 are in a trade-off relationship with each other in terms of crack generation due to a difference between the tensile stress and the compressive stress respectively applied thereto.

Referring to FIG. 5B, it may be identified that in the first embodiment of the display apparatus 1, the magnitude of the tensile stress A' applied to the polarizing member 500 increases by a ratio of about 0.025 in the (+) tensile direction. It may be identified that in the first embodiment of the display apparatus 1, the magnitude of the compressive stress A" applied to the display panel part 200 increases by a ratio of about 0.012 in the (−) compressive direction.

Therefore, it may be identified that in the first embodiment display apparatus 1, the difference A between the magnitude of the tensile stress A' applied to the polarizing member 500 and the magnitude of the compressive stress A" applied to the display panel part 200 has a ratio of about 0.037, as described above with reference to FIG. 3.

Accordingly, it may be identified that in the first embodiment of display apparatus 1, the difference A between the magnitude of the tensile stress A' applied to the polarizing member 500 and the magnitude of the compressive stress A" applied to the display panel part 200 is quite large.

Referring to FIG. 5B, it may be identified that in the second embodiment of the display apparatus 1, the magnitude of the tensile stress B' applied to the polarizing member 500 increases by a ratio of about 0.03 in the (+) tensile direction. It may be identified that in the second embodiment, the magnitude of the compressive stress B" applied to the display panel part 200 increases by a ratio of about 0.01 in the (−) compressive direction.

Therefore, it may be identified that in the second embodiment of the display apparatus 1, the difference B between the magnitude of the tensile stress B' applied to the polarizing member 500 and the magnitude of the compressive stress B" applied to the display panel part 200 has a ratio of about 0.04, as described above with reference to FIG. 3.

Accordingly, it may be identified that in the second embodiment of the display apparatus 1, the difference B between the magnitude of tensile stress B" applied to the polarizing member 500 and the magnitude of compressive stress B" applied to the display panel part 200 is quite large.

Referring to FIG. 5B, it may be identified that in one or more embodiments of the display apparatus 2, the magnitude of the tensile stress C' applied to the polarizing member 500 increases by a ratio of about 0.023 in the (+) tensile direction. It may be identified that in embodiments of the display apparatus 2, the magnitude of the compressive stress C" applied to the display panel part 200 increases by a ratio of about 0.006 in the (−) compressive direction.

Therefore, it may be identified that in embodiments of the display apparatus 2, the difference C between the magnitude of the tensile stress C' applied to the polarizing member 500 and the magnitude of the compressive stress C" applied to the display panel part 200 has a ratio of about 0.029.

Accordingly, it may be identified that the difference C between the magnitude of the tensile stress C' applied to the polarizing member 500 and the magnitude of the compressive stress C" applied to the display panel part 200 in embodiments of the display apparatus 2 decreases significantly, compared to each of the difference A according to the first embodiment of the display apparatus 1 and the difference B according to the second embodiment of the display apparatus 1.

Thus, according to one or more embodiments of the present disclosure, the tensile stress applied to the lower portion of the polarizing member 500 may be reduced, and the compressive stress applied to the upper portion of the display panel part 200 may be reduced.

When the neutral plane compensation member 300 is additionally disposed between the polarizing member 500 and the display panel part 200 as in embodiments of the display apparatus 2, the neutral plane compensation member 300 may function as a compensation layer to reduce the stress applied to the lower portion of the polarizing member 500 and the stress applied to the upper portion of the display panel part 200.

Therefore, according to one or more embodiments of the present disclosure, the neutral plane compensation member 300 including the first layer 310 and the second layer 301 is disposed between the polarizing member 500 and the display panel part 200, such that the difference between the tensile stress and the compressive stress respectively applied to the polarizing member 500 and the display panel part 200 may be reduced.

A thickness of the first layer 310 of the neutral plane compensation member 300 may be in a range of 20 μm to 60 μm, and a modulus (which may be a modulus of elasticity) thereof may be in a range of $1.0 \times 10^8$ Pa to $1.0 \times 10^{10}$ Pa, while a thickness of the second layer 301 thereof may be in a range of 20 μm to 60 μm, and a modulus thereof may be in a range of $1.0 \times 10^4$ Pa to $1.0 \times 10^6$ Pa.

In accordance with embodiments of the present disclosure, the modulus is measured based on –20° C.

When the thickness and the modulus of the first layer 310 and the thickness and the modulus of the second layer 301 are out of the above defined ranges, the stress applied to the polarizing member 500 and the stress applied to the display panel part 200 may vary. This may cause a defect. Thus, while dimensions and moduli outside the above ranges may be less preferred, they are contemplated in the present disclosure and the disclosure should not be limited strictly to the above ranges.

In one embodiment of the present disclosure, the thickness of the first layer 310 may be 25 μm, the thickness of the second layer 301 may be 25 μm, and the modulus of the second layer 301 may be in a range of $0.7 \times 10^5$ Pa to $2.3 \times 10^5$ Pa.

In another embodiment of the present disclosure, the thickness of the first layer 310 may be 50 μm, the thickness of the second layer 301 may be 25 μm, and the modulus of the second layer 301 may be in a range of $0.5 \times 10^5$ Pa to $2.5 \times 10^5$ Pa.

In another embodiment of the present disclosure, the thickness of the first layer 310 may be 25 μm, the thickness of the second layer 301 may be 50 μm, and the modulus of the second layer 301 may be in a range of $1.0 \times 10^5$ Pa to $2.2 \times 10^5$ Pa.

In another embodiment of the present disclosure, the thickness of the first layer 310 may be 50 μm, the thickness of the second layer 301 may be 50 μm, and the modulus of the second layer 301 may be in a range of $0.6 \times 10^5$ Pa to $2.4 \times 10^5$ Pa.

Figure 6:
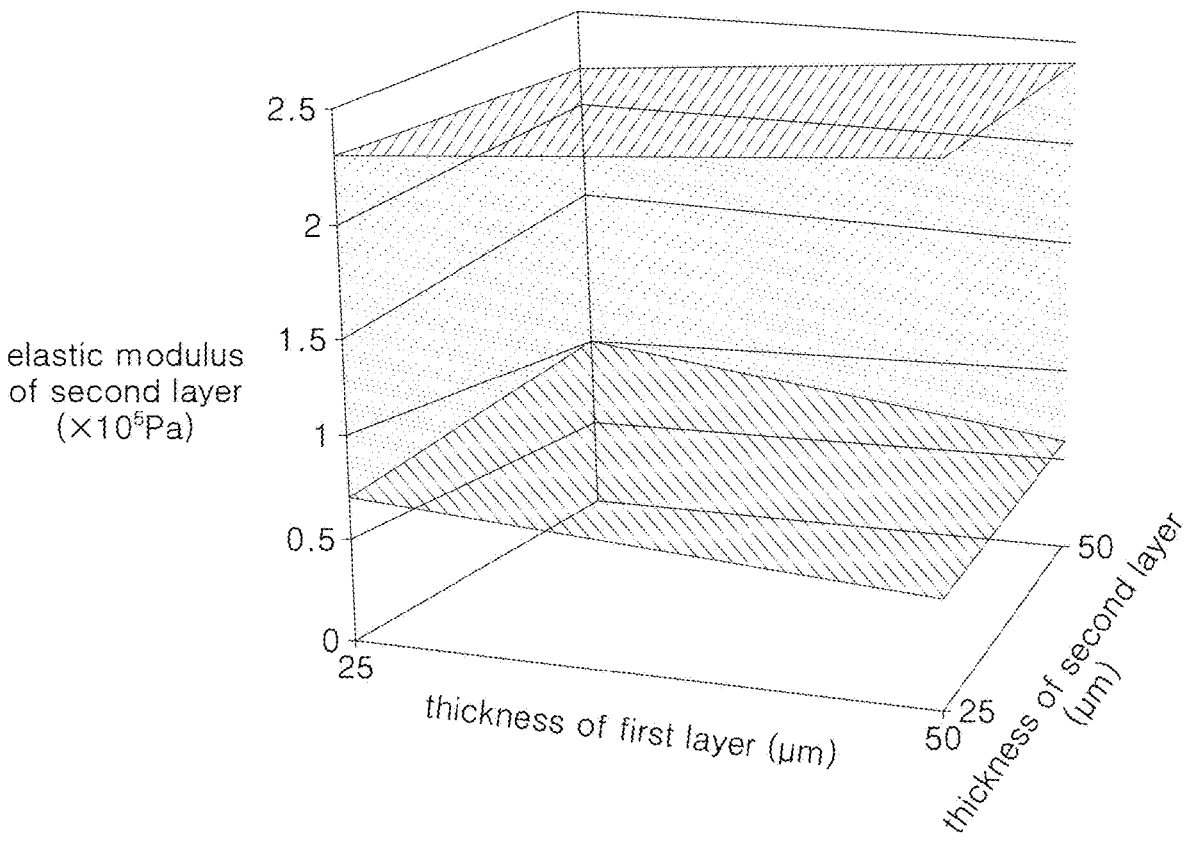
FIG. 6 illustrates a thickness of each of a first layer and a second layer of a neutral plane compensation member according to an embodiment of the present disclosure, and an applicable range of an elastic modulus of the second layer thereof.

FIG. 6 illustrates a thickness of each of the first layer 310 and the second layer 301 of the neutral plane compensation member 300 according to an embodiment of the present disclosure, and a range of an elastic modulus of the second layer 301 based on the thickness.

FIG. 6 illustrates a graph of a measurement of minimum and maximum values of the elastic modulus of the second layer 301 when a thickness of the first layer 310 is in a range of 25 μm to 50 μm, and a thickness of the second layer 301 is in a range of 25 μm to 50 μm.

An applicable range of a modulus of the second layer 301 which does not cause the defect may vary depending on a thickness of the first layer 310 and a thickness of the second layer 301.

Referring to FIG. 6, it may be identified that when a thickness of the first layer 310 is 50 μm and a thickness of the second layer 301 is 25 μm, a modulus of the second layer 301 is in a range of $0.5 \times 10^5$ Pa to $2.5 \times 10^5$ Pa, and, in this setting, an applicable range of the elastic modulus of the second layer 301 is widest.

Further, Table 1 to Table 4 below show the minimum and maximum values of the elastic modulus of the second layer 301 as measured in thickness change on 1 μm basis when a thickness of the first layer 310 is in a range of 25 μm to 50 μm, and a thickness of the second layer 301 is in a range of 25 μm to 50 μm.

TABLE 1

| Second layer modulus (×10⁵ Pa) | | | First layer thickness | | | | | | | | | | | | | |
|---|---|---|---|---|---|---|---|---|---|---|---|---|---|---|---|
| | | | 25 | 26 | 27 | 28 | 29 | 30 | 31 | 32 | 33 | 34 | 35 | 36 | 37 |
| Second layer thickness | 25 | min. | 0.70 | 0.69 | 0.68 | 0.68 | 0.67 | 0.66 | 0.65 | 0.64 | 0.64 | 0.63 | 0.62 | 0.61 | 0.60 |
| | | Max. | 2.30 | 2.31 | 2.32 | 2.32 | 2.33 | 2.34 | 2.35 | 2.36 | 2.36 | 2.37 | 2.38 | 2.39 | 2.40 |
| | 26 | min. | 0.71 | 0.70 | 0.70 | 0.69 | 0.68 | 0.67 | 0.66 | 0.65 | 0.65 | 0.64 | 0.63 | 0.62 | 0.61 |
| | | Max. | 2.30 | 2.30 | 2.31 | 2.32 | 2.33 | 2.34 | 2.34 | 2.35 | 2.36 | 2.37 | 2.38 | 2.38 | 2.39 |
| | 27 | min. | 0.72 | 0.72 | 0.71 | 0.70 | 0.69 | 0.68 | 0.67 | 0.66 | 0.65 | 0.65 | 0.64 | 0.63 | 0.62 |
| | | Max. | 2.29 | 2.30 | 2.31 | 2.32 | 2.32 | 2.33 | 2.34 | 2.35 | 2.36 | 2.36 | 2.37 | 2.38 | 2.39 |
| | 28 | min. | 0.74 | 0.73 | 0.72 | 0.71 | 0.70 | 0.69 | 0.68 | 0.67 | 0.66 | 0.66 | 0.65 | 0.64 | 0.63 |
| | | Max. | 2.29 | 2.30 | 2.30 | 2.31 | 2.32 | 2.33 | 2.34 | 2.34 | 2.35 | 2.36 | 2.37 | 2.38 | 2.38 |
| | 29 | min. | 0.75 | 0.74 | 0.73 | 0.72 | 0.71 | 0.70 | 0.69 | 0.68 | 0.67 | 0.66 | 0.66 | 0.65 | 0.64 |
| | | Max. | 2.28 | 2.29 | 2.30 | 2.31 | 2.32 | 2.32 | 2.33 | 2.34 | 2.35 | 2.36 | 2.36 | 2.37 | 2.38 |
| | 30 | min. | 0.76 | 0.75 | 0.74 | 0.73 | 0.72 | 0.71 | 0.70 | 0.69 | 0.68 | 0.67 | 0.66 | 0.65 | 0.64 |
| | | Max. | 2.28 | 2.29 | 2.30 | 2.30 | 2.31 | 2.32 | 2.33 | 2.34 | 2.34 | 2.35 | 2.36 | 2.37 | 2.38 |
| | 31 | min. | 0.77 | 0.76 | 0.75 | 0.74 | 0.73 | 0.72 | 0.71 | 0.70 | 0.69 | 0.68 | 0.67 | 0.66 | 0.65 |
| | | Max. | 2.28 | 2.28 | 2.29 | 2.30 | 2.31 | 2.32 | 2.32 | 2.33 | 2.34 | 2.35 | 2.36 | 2.36 | 2.37 |
| | 32 | min. | 0.78 | 0.77 | 0.76 | 0.75 | 0.74 | 0.73 | 0.72 | 0.71 | 0.70 | 0.69 | 0.68 | 0.67 | 0.66 |
| | | Max. | 2.27 | 2.28 | 2.29 | 2.30 | 2.30 | 2.31 | 2.32 | 2.33 | 2.34 | 2.34 | 2.35 | 2.36 | 2.37 |
| | 33 | min. | 0.80 | 0.79 | 0.77 | 0.76 | 0.75 | 0.74 | 0.73 | 0.72 | 0.71 | 0.70 | 0.69 | 0.68 | 0.67 |
| | | Max. | 2.27 | 2.28 | 2.28 | 2.29 | 2.30 | 2.31 | 2.32 | 2.32 | 2.33 | 2.34 | 2.35 | 2.36 | 2.36 |
| | 34 | min. | 0.81 | 0.80 | 0.79 | 0.78 | 0.76 | 0.75 | 0.74 | 0.73 | 0.72 | 0.71 | 0.70 | 0.69 | 0.68 |
| | | Max. | 2.26 | 2.27 | 2.28 | 2.29 | 2.30 | 2.30 | 2.31 | 2.32 | 2.33 | 2.34 | 2.34 | 2.35 | 2.36 |
| | 35 | min. | 0.82 | 0.81 | 0.80 | 0.79 | 0.78 | 0.76 | 0.75 | 0.74 | 0.73 | 0.72 | 0.71 | 0.70 | 0.69 |
| | | Max. | 2.26 | 2.27 | 2.28 | 2.28 | 2.29 | 2.30 | 2.31 | 2.32 | 2.32 | 2.33 | 2.34 | 2.35 | 2.36 |
| | 36 | min. | 0.83 | 0.82 | 0.81 | 0.80 | 0.79 | 0.77 | 0.76 | 0.75 | 0.74 | 0.73 | 0.72 | 0.71 | 0.69 |
| | | Max. | 2.26 | 2.26 | 2.27 | 2.28 | 2.29 | 2.30 | 2.30 | 2.31 | 2.32 | 2.33 | 2.34 | 2.34 | 2.35 |
| | 37 | min. | 0.84 | 0.83 | 0.82 | 0.81 | 0.80 | 0.78 | 0.77 | 0.76 | 0.75 | 0.74 | 0.73 | 0.71 | 0.70 |
| | | Max. | 2.25 | 2.26 | 2.27 | 2.28 | 2.28 | 2.29 | 2.30 | 2.31 | 2.32 | 2.32 | 2.33 | 2.34 | 2.35 |

TABLE 2

| Second layer | | | First layer thickness | | | | | | | | | | | | |
|---|---|---|---|---|---|---|---|---|---|---|---|---|---|---|---|
| modulus (×10⁵ Pa) | | | 38 | 39 | 40 | 41 | 42 | 43 | 44 | 45 | 46 | 47 | 48 | 49 | 50 |
| Second layer thickness | 25 | min. | 0.60 | 0.59 | 0.58 | 0.57 | 0.56 | 0.56 | 0.55 | 0.54 | 0.53 | 0.52 | 0.52 | 0.51 | 0.50 |
| | | Max. | 2.40 | 2.41 | 2.42 | 2.43 | 2.44 | 2.44 | 2.45 | 2.46 | 2.47 | 2.48 | 2.48 | 2.49 | 2.50 |
| | 26 | min. | 0.60 | 0.60 | 0.59 | 0.58 | 0.57 | 0.56 | 0.55 | 0.55 | 0.54 | 0.53 | 0.52 | 0.51 | 0.50 |
| | | Max. | 2.40 | 2.41 | 2.42 | 2.42 | 2.43 | 2.44 | 2.45 | 2.46 | 2.46 | 2.47 | 2.48 | 2.49 | 2.50 |
| | 27 | min. | 0.61 | 0.60 | 0.59 | 0.59 | 0.58 | 0.57 | 0.56 | 0.55 | 0.54 | 0.53 | 0.53 | 0.52 | 0.51 |
| | | Max. | 2.40 | 2.40 | 2.41 | 2.42 | 2.43 | 2.44 | 2.44 | 2.45 | 2.46 | 2.47 | 2.48 | 2.48 | 2.49 |
| | 28 | min. | 0.62 | 0.61 | 0.60 | 0.59 | 0.58 | 0.57 | 0.57 | 0.56 | 0.55 | 0.54 | 0.53 | 0.52 | 0.51 |
| | | Max. | 2.39 | 2.40 | 2.41 | 2.42 | 2.42 | 2.43 | 2.44 | 2.45 | 2.46 | 2.46 | 2.47 | 2.48 | 2.49 |
| | 29 | min. | 0.63 | 0.62 | 0.61 | 0.60 | 0.59 | 0.58 | 0.57 | 0.56 | 0.55 | 0.54 | 0.53 | 0.53 | 0.52 |
| | | Max. | 2.39 | 2.40 | 2.40 | 2.41 | 2.42 | 2.43 | 2.44 | 2.44 | 2.45 | 2.46 | 2.47 | 2.48 | 2.48 |
| | 30 | min. | 0.64 | 0.63 | 0.62 | 0.61 | 0.60 | 0.59 | 0.58 | 0.57 | 0.56 | 0.55 | 0.54 | 0.53 | 0.52 |
| | | Max. | 2.38 | 2.39 | 2.40 | 2.41 | 2.42 | 2.42 | 2.43 | 2.44 | 2.45 | 2.46 | 2.46 | 2.47 | 2.48 |
| | 31 | min. | 0.64 | 0.63 | 0.62 | 0.61 | 0.60 | 0.59 | 0.58 | 0.57 | 0.56 | 0.55 | 0.54 | 0.53 | 0.52 |
| | | Max. | 2.38 | 2.39 | 2.40 | 2.40 | 2.41 | 2.42 | 2.43 | 2.44 | 2.44 | 2.45 | 2.46 | 2.47 | 2.48 |
| | 32 | min. | 0.65 | 0.64 | 0.63 | 0.62 | 0.61 | 0.60 | 0.59 | 0.58 | 0.57 | 0.56 | 0.55 | 0.54 | 0.53 |
| | | Max. | 2.38 | 2.38 | 2.39 | 2.40 | 2.41 | 2.42 | 2.42 | 2.43 | 2.44 | 2.45 | 2.46 | 2.46 | 2.47 |
| | 33 | min. | 0.66 | 0.65 | 0.64 | 0.63 | 0.62 | 0.61 | 0.60 | 0.58 | 0.57 | 0.56 | 0.55 | 0.54 | 0.53 |
| | | Max. | 2.37 | 2.38 | 2.39 | 2.40 | 2.40 | 2.41 | 2.42 | 2.43 | 2.44 | 2.44 | 2.45 | 2.46 | 2.47 |
| | 34 | min. | 0.67 | 0.66 | 0.64 | 0.63 | 0.62 | 0.61 | 0.60 | 0.59 | 0.58 | 0.57 | 0.56 | 0.55 | 0.54 |
| | | Max. | 2.37 | 2.38 | 2.38 | 2.39 | 2.40 | 2.41 | 2.42 | 2.42 | 2.43 | 2.44 | 2.45 | 2.46 | 2.46 |
| | 35 | min. | 0.67 | 0.66 | 0.65 | 0.64 | 0.63 | 0.62 | 0.61 | 0.60 | 0.58 | 0.57 | 0.56 | 0.55 | 0.54 |
| | | Max. | 2.36 | 2.37 | 2.38 | 2.39 | 2.40 | 2.40 | 2.41 | 2.42 | 2.43 | 2.44 | 2.44 | 2.45 | 2.46 |
| | 36 | min. | 0.68 | 0.67 | 0.66 | 0.65 | 0.64 | 0.62 | 0.61 | 0.60 | 0.59 | 0.58 | 0.57 | 0.56 | 0.54 |
| | | Max. | 2.36 | 2.37 | 2.38 | 2.38 | 2.39 | 2.40 | 2.41 | 2.42 | 2.42 | 2.43 | 2.44 | 2.45 | 2.46 |
| | 37 | min. | 0.69 | 0.68 | 0.67 | 0.65 | 0.64 | 0.63 | 0.62 | 0.61 | 0.60 | 0.58 | 0.57 | 0.56 | 0.55 |
| | | Max. | 2.36 | 2.36 | 2.37 | 2.38 | 2.39 | 2.40 | 2.40 | 2.41 | 2.42 | 2.43 | 2.44 | 2.44 | 2.45 |

TABLE 3

| Second layer | | | First layer thickness | | | | | | | | | | | | |
|---|---|---|---|---|---|---|---|---|---|---|---|---|---|---|---|
| modulus (×10⁵ Pa) | | | 25 | 26 | 27 | 28 | 29 | 30 | 31 | 32 | 33 | 34 | 35 | 36 | 37 |
| Second layer thickness | 38 | min. | 0.86 | 0.84 | 0.83 | 0.82 | 0.81 | 0.80 | 0.78 | 0.77 | 0.76 | 0.75 | 0.73 | 0.72 | 0.71 |
| | | Max. | 2.25 | 2.26 | 2.26 | 2.27 | 2.28 | 2.29 | 2.30 | 2.30 | 2.31 | 2.32 | 2.33 | 2.34 | 2.34 |
| | 39 | min. | 0.87 | 0.86 | 0.84 | 0.83 | 0.82 | 0.81 | 0.79 | 0.78 | 0.77 | 0.76 | 0.74 | 0.73 | 0.72 |
| | | Max. | 2.24 | 2.25 | 2.26 | 2.27 | 2.28 | 2.28 | 2.29 | 2.30 | 2.31 | 2.32 | 2.32 | 2.33 | 2.34 |
| | 40 | min. | 0.88 | 0.87 | 0.85 | 0.84 | 0.83 | 0.82 | 0.80 | 0.79 | 0.78 | 0.76 | 0.75 | 0.74 | 0.73 |
| | | Max. | 2.24 | 2.25 | 2.26 | 2.26 | 2.27 | 2.28 | 2.29 | 2.30 | 2.30 | 2.31 | 2.32 | 2.33 | 2.34 |
| | 41 | min. | 0.89 | 0.88 | 0.87 | 0.85 | 0.84 | 0.83 | 0.81 | 0.80 | 0.79 | 0.77 | 0.76 | 0.75 | 0.73 |
| | | Max. | 2.24 | 2.24 | 2.25 | 2.26 | 2.27 | 2.28 | 2.28 | 2.29 | 2.30 | 2.31 | 2.32 | 2.32 | 2.33 |
| | 42 | min. | 0.90 | 0.89 | 0.88 | 0.86 | 0.85 | 0.84 | 0.82 | 0.81 | 0.80 | 0.78 | 0.77 | 0.76 | 0.74 |
| | | Max. | 2.23 | 2.24 | 2.25 | 2.26 | 2.26 | 2.27 | 2.28 | 2.29 | 2.30 | 2.30 | 2.31 | 2.32 | 2.33 |
| | 43 | min. | 0.92 | 0.90 | 0.89 | 0.87 | 0.86 | 0.85 | 0.83 | 0.82 | 0.81 | 0.79 | 0.78 | 0.76 | 0.75 |
| | | Max. | 2.23 | 2.24 | 2.24 | 2.25 | 2.26 | 2.27 | 2.28 | 2.28 | 2.29 | 2.30 | 2.31 | 2.32 | 2.32 |
| | 44 | min. | 0.93 | 0.91 | 0.90 | 0.89 | 0.87 | 0.86 | 0.84 | 0.83 | 0.82 | 0.80 | 0.79 | 0.77 | 0.76 |
| | | Max. | 2.22 | 2.23 | 2.24 | 2.25 | 2.26 | 2.26 | 2.27 | 2.28 | 2.29 | 2.30 | 2.30 | 2.31 | 2.32 |
| | 45 | min. | 0.94 | 0.93 | 0.91 | 0.90 | 0.88 | 0.87 | 0.85 | 0.84 | 0.82 | 0.81 | 0.80 | 0.78 | 0.77 |
| | | Max. | 2.22 | 2.23 | 2.24 | 2.24 | 2.25 | 2.26 | 2.27 | 2.28 | 2.28 | 2.29 | 2.30 | 2.31 | 2.32 |
| | 46 | min. | 0.95 | 0.94 | 0.92 | 0.91 | 0.89 | 0.88 | 0.86 | 0.85 | 0.83 | 0.82 | 0.80 | 0.79 | 0.78 |
| | | Max. | 2.22 | 2.22 | 2.23 | 2.24 | 2.25 | 2.26 | 2.26 | 2.27 | 2.28 | 2.29 | 2.30 | 2.30 | 2.31 |
| | 47 | min. | 0.96 | 0.95 | 0.93 | 0.92 | 0.90 | 0.89 | 0.87 | 0.86 | 0.84 | 0.83 | 0.81 | 0.80 | 0.78 |
| | | Max. | 2.21 | 2.22 | 2.23 | 2.24 | 2.24 | 2.25 | 2.26 | 2.27 | 2.28 | 2.28 | 2.29 | 2.30 | 2.31 |
| | 48 | min. | 0.98 | 0.96 | 0.95 | 0.93 | 0.91 | 0.90 | 0.88 | 0.87 | 0.85 | 0.84 | 0.82 | 0.81 | 0.79 |
| | | Max. | 2.21 | 2.22 | 2.22 | 2.23 | 2.24 | 2.25 | 2.26 | 2.26 | 2.27 | 2.28 | 2.29 | 2.30 | 2.30 |
| | 49 | min. | 0.99 | 0.97 | 0.96 | 0.94 | 0.93 | 0.91 | 0.89 | 0.88 | 0.86 | 0.85 | 0.83 | 0.82 | 0.80 |
| | | Max. | 2.20 | 2.21 | 2.22 | 2.23 | 2.24 | 2.24 | 2.25 | 2.26 | 2.27 | 2.28 | 2.28 | 2.29 | 2.30 |
| | 50 | min. | 1.00 | 0.98 | 0.97 | 0.95 | 0.94 | 0.92 | 0.90 | 0.89 | 0.87 | 0.86 | 0.84 | 0.82 | 0.81 |
| | | Max. | 2.20 | 2.21 | 2.22 | 2.22 | 2.23 | 2.24 | 2.25 | 2.26 | 2.26 | 2.27 | 2.28 | 2.29 | 2.30 |

TABLE 4

| Second layer | | | First layer thickness | | | | | | | | | | | | |
|---|---|---|---|---|---|---|---|---|---|---|---|---|---|---|---|
| modulus (×10⁵ Pa) | | | 38 | 39 | 40 | 41 | 42 | 43 | 44 | 45 | 46 | 47 | 48 | 49 | 50 |
| Second layer thickness | 38 | min. | 0.70 | 0.69 | 0.67 | 0.66 | 0.65 | 0.64 | 0.62 | 0.61 | 0.60 | 0.59 | 0.58 | 0.56 | 0.55 |
| | | Max. | 2.35 | 2.36 | 2.37 | 2.38 | 2.38 | 2.39 | 2.40 | 2.41 | 2.42 | 2.42 | 2.43 | 2.44 | 2.45 |
| | 39 | min. | 0.71 | 0.69 | 0.68 | 0.67 | 0.66 | 0.64 | 0.63 | 0.62 | 0.61 | 0.59 | 0.58 | 0.57 | 0.56 |
| | | Max. | 2.35 | 2.36 | 2.36 | 2.37 | 2.38 | 2.39 | 2.40 | 2.40 | 2.41 | 2.42 | 2.43 | 2.44 | 2.44 |

TABLE 4-continued

| Second layer modulus (×10⁵ Pa) | | First layer thickness | | | | | | | | | | | | |
|---|---|---|---|---|---|---|---|---|---|---|---|---|---|---|
| | | 38 | 39 | 40 | 41 | 42 | 43 | 44 | 45 | 46 | 47 | 48 | 49 | 50 |
| 40 | min. | 0.71 | 0.70 | 0.69 | 0.68 | 0.66 | 0.65 | 0.64 | 0.62 | 0.61 | 0.60 | 0.59 | 0.57 | 0.56 |
| | Max. | 2.34 | 2.35 | 2.36 | 2.37 | 2.38 | 2.38 | 2.39 | 2.40 | 2.41 | 2.42 | 2.42 | 2.43 | 2.44 |
| 41 | min. | 0.72 | 0.71 | 0.70 | 0.68 | 0.67 | 0.66 | 0.64 | 0.63 | 0.62 | 0.60 | 0.59 | 0.58 | 0.56 |
| | Max. | 2.34 | 2.35 | 2.36 | 2.36 | 2.37 | 2.38 | 2.39 | 2.40 | 2.40 | 2.41 | 2.42 | 2.43 | 2.44 |
| 42 | min. | 0.73 | 0.72 | 0.70 | 0.69 | 0.68 | 0.66 | 0.65 | 0.64 | 0.62 | 0.61 | 0.59 | 0.58 | 0.57 |
| | Max. | 2.34 | 2.34 | 2.35 | 2.36 | 2.37 | 2.38 | 2.38 | 2.39 | 2.40 | 2.41 | 2.42 | 2.42 | 2.43 |
| 43 | min. | 0.74 | 0.72 | 0.71 | 0.70 | 0.68 | 0.67 | 0.65 | 0.64 | 0.63 | 0.61 | 0.60 | 0.59 | 0.57 |
| | Max. | 2.33 | 2.34 | 2.35 | 2.36 | 2.36 | 2.37 | 2.38 | 2.39 | 2.40 | 2.40 | 2.41 | 2.42 | 2.43 |
| 44 | min. | 0.74 | 0.73 | 0.72 | 0.70 | 0.69 | 0.67 | 0.66 | 0.65 | 0.63 | 0.62 | 0.60 | 0.59 | 0.58 |
| | Max. | 2.33 | 2.34 | 2.34 | 2.35 | 2.36 | 2.37 | 2.38 | 2.38 | 2.39 | 2.40 | 2.41 | 2.42 | 2.42 |
| 45 | min. | 0.75 | 0.74 | 0.72 | 0.71 | 0.70 | 0.68 | 0.67 | 0.65 | 0.64 | 0.62 | 0.61 | 0.59 | 0.58 |
| | Max. | 2.32 | 2.33 | 2.34 | 2.35 | 2.36 | 2.36 | 2.37 | 2.38 | 2.39 | 2.40 | 2.40 | 2.41 | 2.42 |
| 46 | min. | 0.76 | 0.75 | 0.73 | 0.72 | 0.70 | 0.69 | 0.67 | 0.66 | 0.64 | 0.63 | 0.61 | 0.60 | 0.58 |
| | Max. | 2.32 | 2.33 | 2.34 | 2.34 | 2.35 | 2.36 | 2.37 | 2.38 | 2.38 | 2.39 | 2.40 | 2.41 | 2.42 |
| 47 | min. | 0.77 | 0.75 | 0.74 | 0.72 | 0.71 | 0.69 | 0.68 | 0.66 | 0.65 | 0.63 | 0.62 | 0.60 | 0.59 |
| | Max. | 2.32 | 2.32 | 2.33 | 2.34 | 2.35 | 2.36 | 2.36 | 2.37 | 2.38 | 2.39 | 2.40 | 2.40 | 2.41 |
| 48 | min. | 0.78 | 0.76 | 0.75 | 0.73 | 0.71 | 0.70 | 0.68 | 0.67 | 0.65 | 0.64 | 0.62 | 0.61 | 0.59 |
| | Max. | 2.31 | 2.32 | 2.33 | 2.34 | 2.34 | 2.35 | 2.36 | 2.37 | 2.38 | 2.38 | 2.39 | 2.40 | 2.41 |
| 49 | min. | 0.78 | 0.77 | 0.75 | 0.74 | 0.72 | 0.71 | 0.69 | 0.67 | 0.66 | 0.64 | 0.63 | 0.61 | 0.60 |
| | Max. | 2.31 | 2.32 | 2.32 | 2.33 | 2.34 | 2.35 | 2.36 | 2.36 | 2.37 | 2.38 | 2.39 | 2.40 | 2.40 |
| 50 | min. | 0.79 | 0.78 | 0.76 | 0.74 | 0.73 | 0.71 | 0.70 | 0.68 | 0.66 | 0.65 | 0.63 | 0.62 | 0.60 |
| | Max. | 2.30 | 2.31 | 2.32 | 2.33 | 2.34 | 2.34 | 2.35 | 2.36 | 2.37 | 2.38 | 2.38 | 2.39 | 2.40 |

An in-plane phase retardation value ($R_{in}$) of the neutral plane compensation member 300 may be 5 nm or less, or a phase retardation value ($R_{th}$) in a thickness direction of the neutral plane compensation member 300 may be 40 nm or less.

For example, when a film is not an optical film such as a phase retardation film or a polarizer included in a polarizing member, a phase retardation occurs naturally according to elongation thereof, and it may be very difficult to control the phase retardation value and distribution thereof.

Therefore, according to an embodiment of the present disclosure, the in-plane phase retardation value ($R_{in}$) of the neutral plane compensation member 300 is 5 nm or less, or the phase retardation value ($R_{th}$) in the thickness direction of the neutral plane compensation member 300 is 40 nm or less. In this case, even when the phase retardation distribution is included in the neutral plane compensation member 300, the stain due to differences between antireflections at different positions of the display apparatus due to the phase retardation distribution may be reduced.

The increase in the phase retardation value due to the in-plane phase retardation ($R_{in}$) value of the neutral plane compensation member 300 may be compensated by the phase retardation film layer 520 of the polarizing member 500.

The reason for the occurrence of the stain due to the phase retardation will be described with reference to FIG. 7, and FIG. 8 through FIG. 10.

Figure 7:
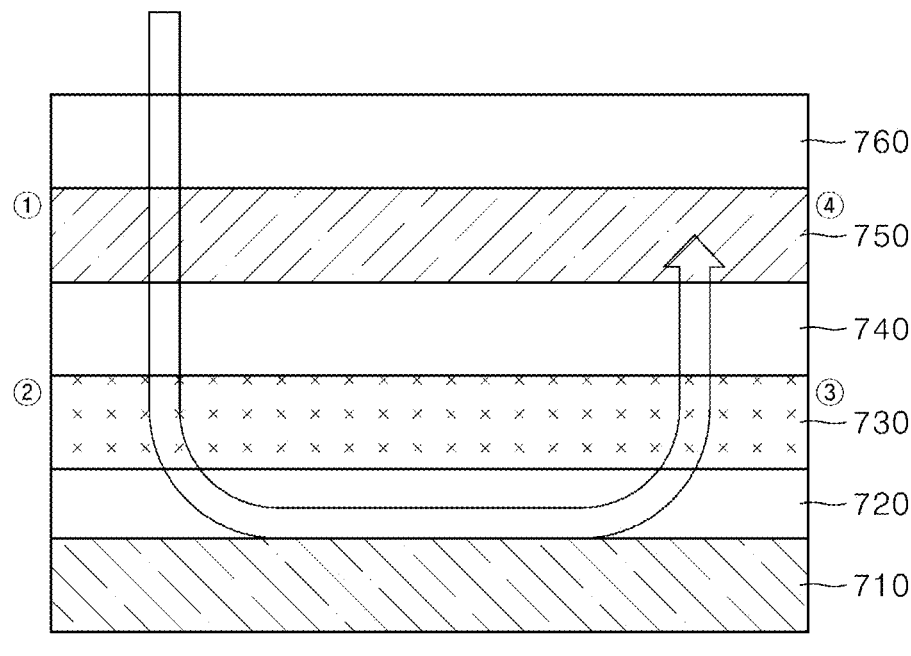
FIG. 7 illustrates a light path where light incident on a display apparatus emits by a polarizing member and a reflective plate of a display panel part.

FIG. 7 illustrates a light path where light incident on a display apparatus emits through a polarizing member and a reflective plate of a display panel.

An adhesive layer 720 may be disposed on a reflective plate 710 of the display panel part. A phase retardation layer 730, an inner protective base 740, a polarizer 750, and an outer protective base 760 may be disposed on the adhesive layer 720.

The polarizer 750 may be a PVA (polyvinyl alcohol) film having a phase retardation of 0 degrees. The phase retardation layer 730 may be a quarter-wavelength phase retardation film.

As unpolarized light incident from an outside passes through the polarizer 750 at ①, only a first polarized orthogonal component of the light, which is one of two polarized orthogonal components, may transmit therethrough.

The polarized light is converted into circularly polarized light while passing through the phase retardation layer 730 at ②. Then, the circularly polarized light is reflected from the reflective plate 710 of the display panel part and thus the circular polarized direction may be changed.

As the circularly polarized light passes through the phase retardation layer 730 again at ③, only a second polarized orthogonal component, which is the other of the two polarized orthogonal components, may transmit therethrough.

The second polarized orthogonal component does not pass through the polarizer 750 at ④, such that light does not emit toward the outside, so that the polarizing member may obtain an antireflection effect.

With reference to the optical path of this circular polarizing plate, the change in the polarized state of the light is described using the Poincare sphere.

Figure 8A:
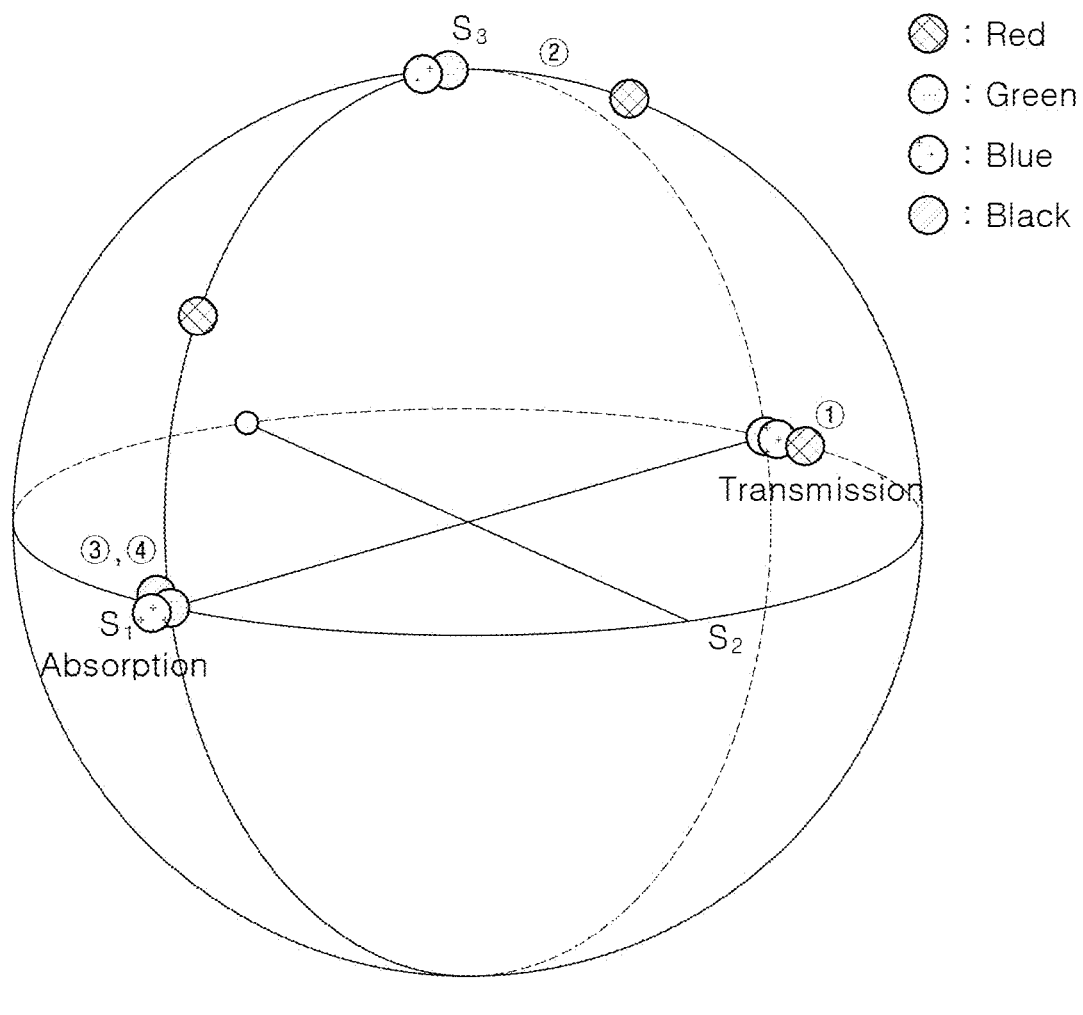
FIG. 8A illustrates change in a polarized state of light of a reference example according to a circular polarizing plate of FIG. 7 in a Poincare sphere for comparison of stains based on a phase retardation.
Figure 8B:
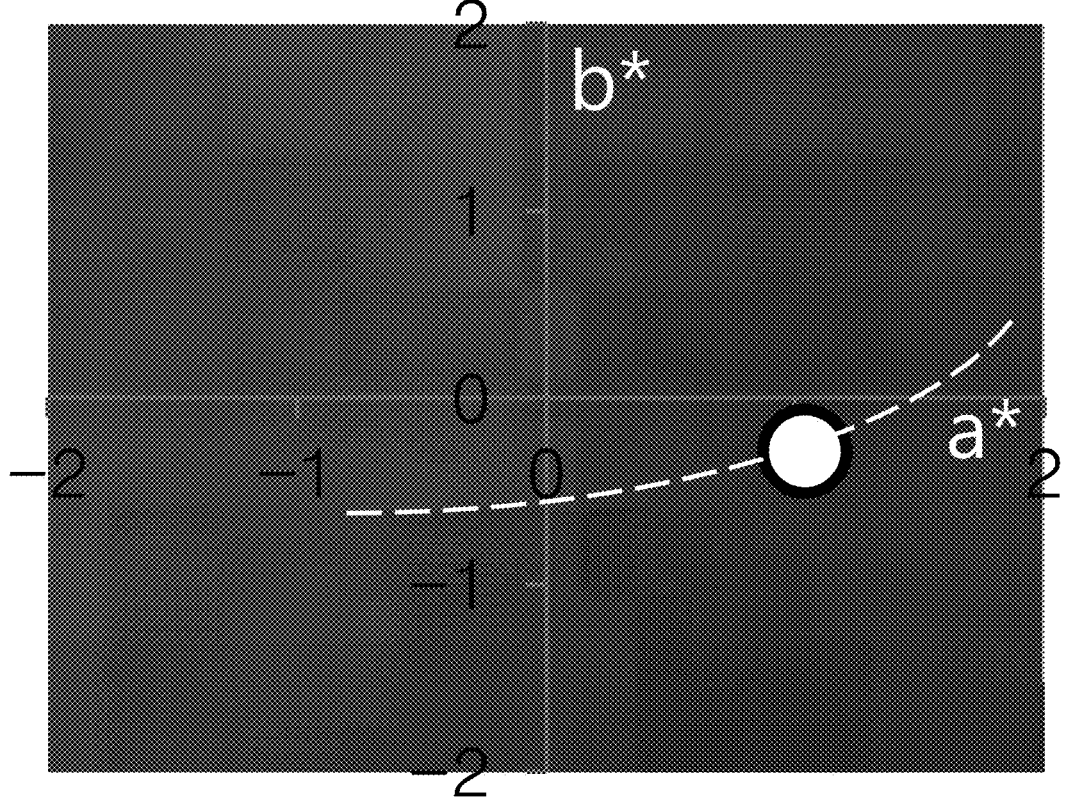
FIG. 8B illustrates a reflection visual perception.

FIG. 8A illustrates change in a polarized state of light of a reference example according to a circular polarizing plate of FIG. 7 in a Poincare sphere for comparison of stains based on a phase retardation. FIG. 8B illustrates a reflection visual perception.

FIG. 8A illustrates change (①, ②, ③, ④) in the polarized state of the light passing through the circular polarizing plate as described with reference to FIG. 7 using the Poincare sphere.

The Poincare sphere expresses all polarized states of light on a sphere. An equator represents liner polarization, one pole S3 represents left-handed circular polarization, and the opposite pole −S3 represents right-handed circular polarization. An upper hemisphere may represent left-handed elliptical polarization, and a lower hemisphere may represent right-handed elliptical polarization.

FIG. 8B illustrates a color space using green-red color coordinates (a*) and blue-yellow color coordinates (b*). When a* increases in a positive direction, this may mean that an object become redder. When a* increases in a negative direction, this may mean that an object become greener.

Therefore, referring to FIG. 8A and FIG. 8B, it may be identified that when light passes through the circularly polarizing plate as a reference, the display apparatus as the object illustrates a reflection visual perception of a red color.

Figure 9A:
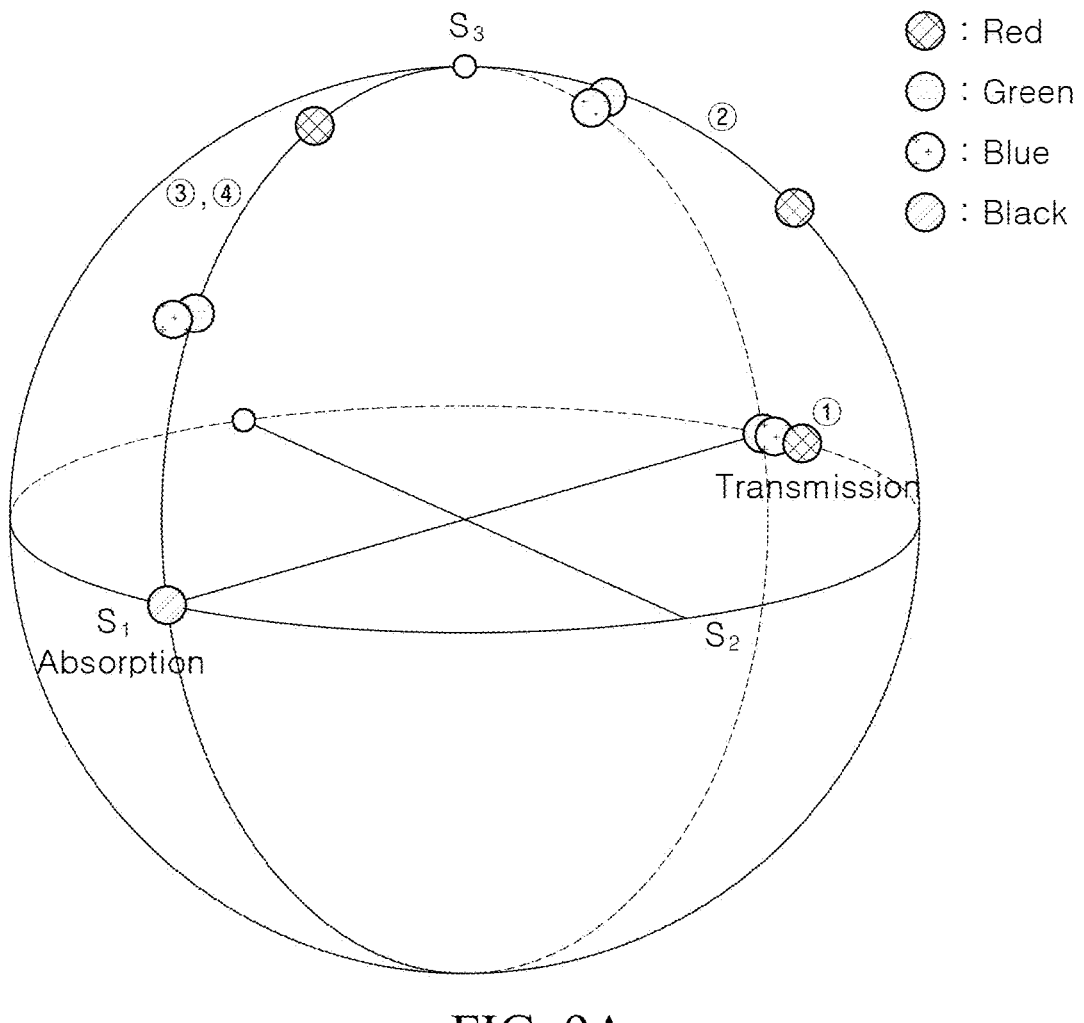
FIG. 9A illustrates change in a polarized state of light in a Poincare sphere when a phase retardation decreases compared to that in FIG. 8A.
Figure 9B:
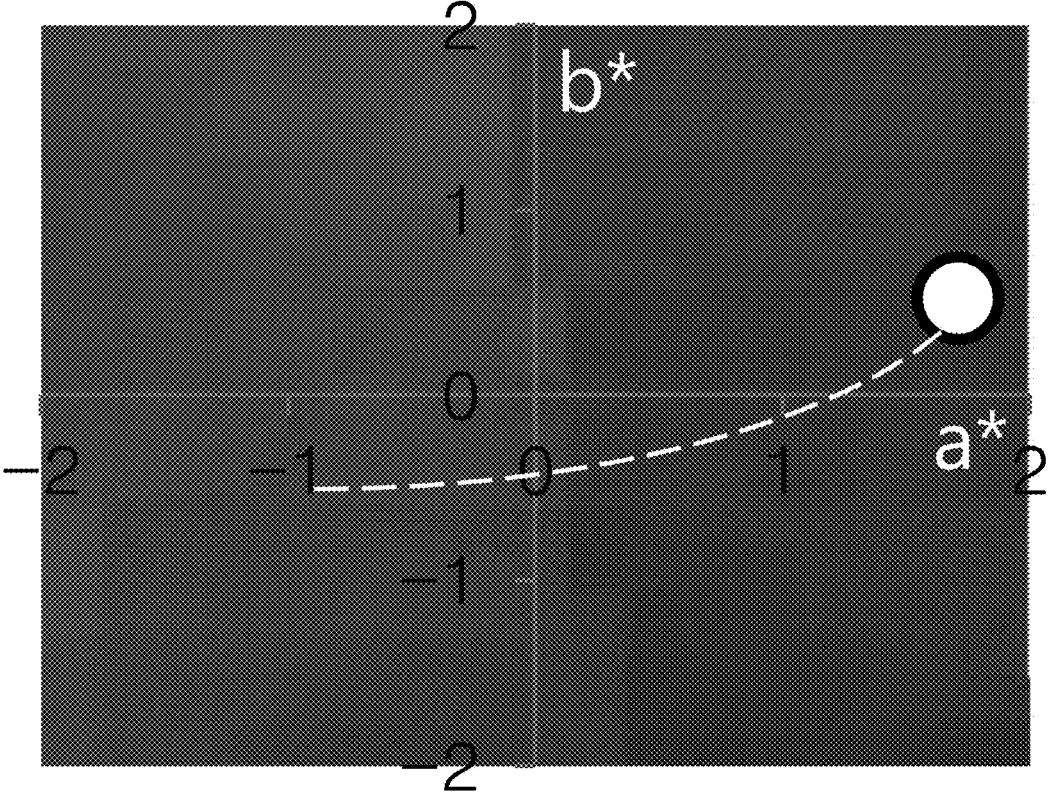
FIG. 9B illustrates a reflection visual perception.

FIG. 9A illustrates change in a polarized state of light in a Poincare sphere when a phase retardation decreases compared to that in FIG. 8A, and FIG. 9B illustrates a reflection visual perception.

Referring to FIG. 9a and FIG. 9B, it may be identified that when the phase retardation decreases compared to FIG. 8A and FIG. 8B as the reference, brighter red visual perception is achieved.

Referring to FIG. 9A, it may be identified that when the phase retardation decreases, the red light, the green light, and the blue light are relatively left elliptically polarized in comparison with FIG. 8A as the reference.

Accordingly, referring to FIG. 9B, as the a* value increases in the positive direction, the object may become redder than in FIG. 8B as the reference.

Figure 10A:
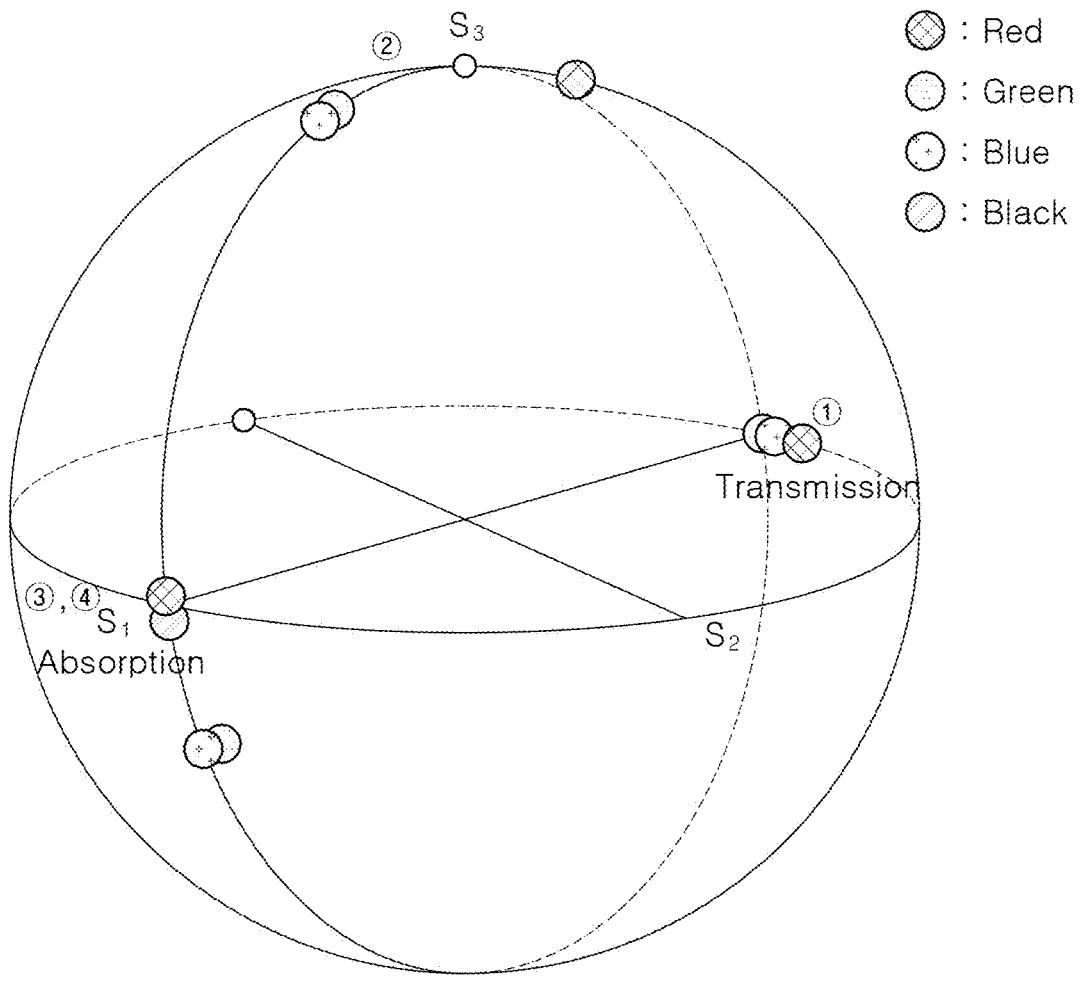
FIG. 10A illustrates change in a polarized state of light in a Poincare sphere when a phase retardation increases compared to that in FIG. 8A.
Figure 10B:
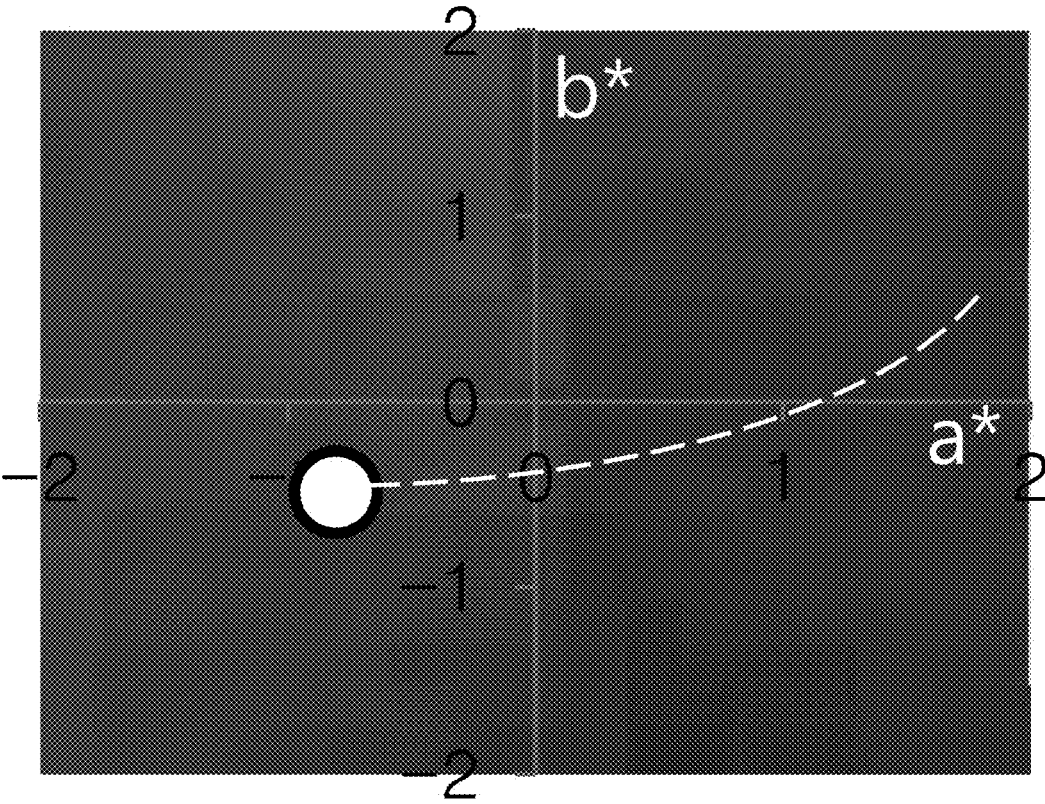
FIG. 10B illustrates a reflection visual perception.

FIG. 10A illustrates change in a polarized state of light in a Poincare sphere when a phase retardation increases compared to that in FIG. 8A, and FIG. 10B illustrates a reflection visual perception.

Referring to FIG. 10A and FIG. 10B, it may be identified that when the phase retardation increases compared to FIGS. 8A and 8B as the reference, cyan visual perception is achieved.

Referring to FIG. 10A, it may be identified that when the phase retardation increases, the red light, the green light, and the blue light are relatively right elliptically polarized compared to FIG. 8A as the reference.

Accordingly, referring to FIG. 10B, as the a* value increases in the negative direction, the object may become greener compared to FIG. 8B as the reference.

Thus, referring to FIG. 8 to FIG. 10, it may be identified that the color is changed relative to the reference example when the phase retardation increases or decreases.

Therefore, when a distribution of the first layer is large, different positions have different phase retardations and thus have different colors. Thus, there is a possibility that the stain may occur on the display apparatus.

Accordingly, according to an embodiment of the present disclosure, the in-plane phase retardation ($R_{in}$) value of the neutral plane compensation member 300 is 5 nm or less, or the phase retardation ($R_{th}$) value in a thickness direction of the neutral plane compensation member 300 is 40 nm or less. Thus, even when the phase retardation distribution is included in the neutral plane compensation member 300, the stain due to differences between antireflections at different positions of the display apparatus due to the phase retardation distribution may be reduced.

Further, an in-plane phase retardation ($R_{in}$) axis of the neutral plane compensation member 300 may be horizontal or perpendicular to an in-plane phase retardation ($R_{in}$) axis of the phase retardation film layer 520 which is the quarter-wavelength plate QWP.

Figure 11:
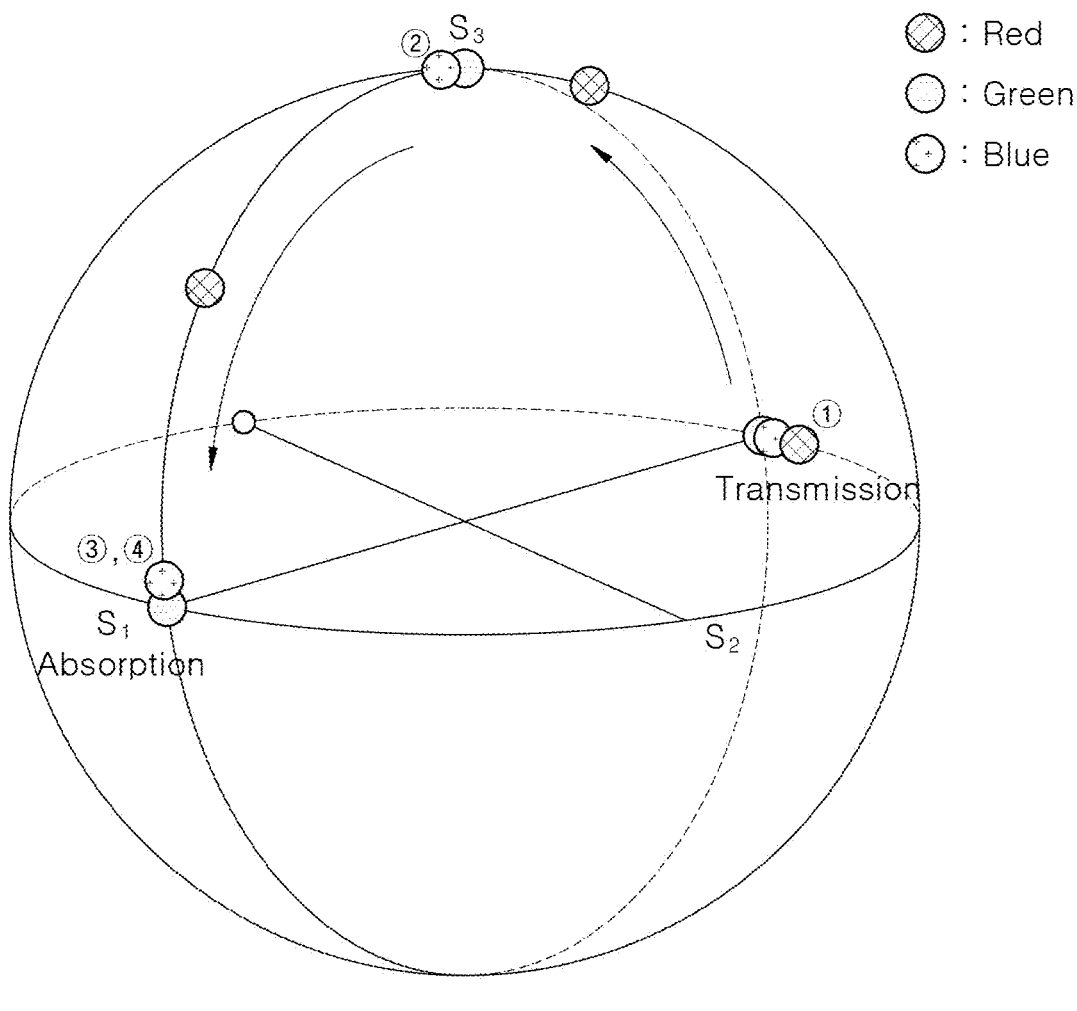
FIG. 11 illustrates change in a polarized state of light according to the circular polarizing plate of FIG. 6 in a Poincare sphere.

FIG. 11 illustrates change in a polarized state of light according to the circular polarizing plate of FIG. 6 in a Poincare sphere.

Referring to FIG. 11, axes of the polarizer 750 as a PVA film with 0 degree phase retardation of the polarizing plate, and the phase retardation layer 730 as the quarter-wavelength phase retardation film are optimized. Thus, movement on the Poincare sphere due to the reflection may occur in an order of S1 (①), S3 (②), and S1 (③, ④).

When an axis of the neutral plane compensation member 300 according to an embodiment of the present disclosure is horizontal or perpendicular to an axis of the quarter-wavelength phase retardation film, the phase retardation value applied to the linearly polarized light transmitting through the polarizer may be equal to a phase retardation value (140 nm) of the quarter-wavelength phase retardation film±a phase retardation value (5 nm) of the neutral plane compensation member 300.

However, when the axis of the neutral plane compensation member 300 according to an embodiment of the present disclosure is changed such that an angle defined between the axis thereof and the axis of the quarter-wavelength phase retardation film is 45 degrees or an arbitrary angle, the phase retardation value applied to the linearly polarized light transmitting through the polarizer may not be equal to a phase retardation value (140 nm) of the quarter-wavelength phase retardation film±a phase retardation value (5 nm) of the neutral plane compensation member 300. Thus, it can be difficult to control the value.

Accordingly, certain display apparatuses may have problems such as local reflective staining, reflectance difference due to different process errors that may occur based on different production orders of the display apparatus, reflectance due to process adhesion distribution, and color difference.

Therefore, according to an embodiment of the present disclosure, the neutral plane compensation member 300 disposed between the polarizing member 500 and the display panel part 200 has a minimum phase retardation value below a predefined value, as described above, thereby reducing or preventing the occurrence of the stains due to the phase retardation.

Further, according to an embodiment of the present disclosure, the overall thickness of the display apparatus 1 increases due to the neutral plane compensation member 300 having the predetermined thickness disposed between the polarizing member 500 and the display panel part 200, such that the puncture strength of the display apparatus 1 may increase.

When the puncture strength of the display apparatus 1 increases, a peeling (or lift-off) phenomenon between the layers, or cracks in the polarizing member may be greatly reduced even when the display apparatus 1 is folded.

A display apparatus according to an embodiment of the present disclosure may be described as follows.

A display apparatus according to an embodiment of the present disclosure may include a display panel, a polarizing member, and a neutral plane compensation member disposed between the display panel and the polarizing member.

According to some embodiments of the present disclosure, the neutral plane compensation member includes a first layer and a second layer, a thickness of the first layer may be in a range of 20 μm to 60 μm, and a modulus of the first layer may be in a range of $10^8$ Pa to $10^{10}$ Pa, and a thickness of the second layer may be in a range of 20 μm to 60 μm, and a modulus of the second layer may be in a range of $10^4$ Pa to $10^6$ Pa.

According to some embodiments of the present disclosure, the polarizing member may include a polarizing film layer, a retardation film layer, and a compensation film layer.

According to some embodiments of the present disclosure, an in-plane retardation value of the neutral plane compensation member may be 5 nm or less.

According to some embodiments of the present disclosure, a retardation value in a thickness direction of the neutral plane compensation member may be 40 nm or less.

According to some embodiments of the present disclosure, the retardation film layer may be a quarter-wavelength plate, wherein an in-plane retardation axis of the neutral plane compensation member may be horizontal or perpendicular to an in-plane retardation axis of the quarter-wavelength plate.

According to some embodiments of the present disclosure, a thickness of the first layer may be 25 μm, a thickness of the second layer may be 25 μm, and a modulus of the second layer may be in a range of $0.7×10^5$ Pa to $2.3×10^5$ Pa.

According to some embodiments of the present disclosure, a thickness of the first layer may be 50 μm, a thickness of the second layer may be 25 μm, and a modulus of the second layer may be in a range of $0.5×10^5$ Pa to $2.5×10^5$ Pa.

According to some embodiments of the present disclosure, a thickness of the first layer may be 25 μm, a thickness of the second layer may be 50 μm, and a modulus of the second layer may be in a range of $1.0×10^5$ Pa to $2.2×10^5$ Pa.

According to some embodiments of the present disclosure, a thickness of the first layer may be 50 μm, a thickness of the second layer may be 50 μm, and a modulus of the second layer may be in a range of $0.6×10^5$ Pa to $2.4×10^5$ Pa.

According to some embodiments of the present disclosure, the polarizing film layer, the phase retardation film layer, and the compensation film layer may be sequentially stacked in a direction toward the neutral plane compensation member.

According to some embodiments of the present disclosure, the retardation film layer may include a quarter-wavelength plate, the compensation film layer may include a +C plate layer, and the quarter-wavelength plate and the +C plate layer may include liquid crystals oriented in one direction.

According to some embodiments of the present disclosure, the display panel part may include an anode electrode, a light-emitting element layer, a cathode electrode, and a sealing layer stacked in a direction toward the neutral plane compensation member.

According to some embodiments of the present disclosure, the display panel part may include a touch electrode layer, the touch electrode layer may be disposed on the sealing layer.

A flexible display apparatus according to an embodiment of the present disclosure may include a display panel, a polarizing member, and a neutral plane compensation member disposed between the display panel part and the polarizing member.

According to some embodiments of the present disclosure, the neutral plane compensation member includes a first layer and a second layer, a thickness of the first layer may be in a range of 20 μm to 60 μm, and a modulus of the first layer may be in a range of $10^8$ Pa to $10^{10}$ Pa, a thickness of the second layer may be in a range of 20 μm to 60 μm, and a modulus of the second layer may be in a range of $10^4$ Pa to $10^6$ Pa, and the apparatus may be bent or folded toward the display panel.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/ or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display apparatus, comprising:
a display panel;
a polarizing member disposed on the display panel; and
a neutral plane compensation member disposed between the display panel and the polarizing member, the neutral plane compensation member including a first layer and a second layer,
a thickness of the first layer being in a range of 20 μm to 60 μm, and a modulus of elasticity of the first layer being in a range of $1×10^8$ Pa to $1×10^{10}$ Pa, and
a thickness of the second layer being in a range of 20 μm to 60 μm, and a modulus of elasticity of the second layer is in a range of $1×10^4$ Pa to $1×10^6$ Pa.

2. The display apparatus of claim 1, wherein the polarizing member includes a polarizing film layer, a retardation film layer, and a compensation film layer.

3. The display apparatus of claim 1, wherein an in-plane retardation value of the neutral plane compensation member is 5 nm or less.

4. The display apparatus of claim 1, wherein a retardation value in a thickness direction of the neutral plane compensation member is 40 nm or less.

5. The display apparatus of claim 2, wherein the retardation film layer is a quarter-wavelength plate, and
wherein an in-plane retardation axis of the neutral plane compensation member is horizontal or perpendicular to an in-plane retardation axis of the quarter-wavelength plate.

6. The display apparatus of claim 1, wherein the thickness of the first layer is 25 μm, the thickness of the second layer is 25 μm, and the modulus of elasticity of the second layer is in a range of $0.7×10^5$ Pa to $2.3×10^5$ Pa.

7. The display apparatus of claim 1, wherein the thickness of the first layer is 50 μm, the thickness of the second layer is 25 μm, and the modulus of elasticity of the second layer is in a range of $0.5×10^5$ Pa to $2.5×10^5$ Pa.

8. The display apparatus of claim 1, wherein the thickness of the first layer is 25 μm, the thickness of the second layer is 50 μm, and the modulus of elasticity of the second layer is in a range of $1.0×10^5$ Pa to $2.2×10^5$ Pa.

9. The display apparatus of claim 1, wherein the thickness of the first layer is 50 μm, the thickness of the second layer is 50 μm, and the modulus of elasticity of the second layer is in a range of $0.6×10^5$ Pa to $2.4×10^5$ Pa.

10. The display apparatus of claim 2, wherein the polarizing film layer, the retardation film layer, and the compensation film layer are sequentially stacked in a direction toward the neutral plane compensation member.

11. The display apparatus of claim 10, wherein the retardation film layer is a quarter-wavelength plate,
wherein the compensation film layer is a +C plate layer, and wherein the quarter-wavelength plate and the +C plate layer include liquid crystals oriented in one direction.

12. The display apparatus of claim 1, wherein the display panel includes an anode electrode, a light-emitting element layer, a cathode electrode, and a sealing layer stacked in a direction toward the neutral plane compensation member.

13. The display apparatus of claim 12, wherein the display panel includes a touch electrode layer disposed on the sealing layer.

14. A flexible display apparatus, comprising:
a display panel;
a polarizing member disposed on the display panel; and
a neutral plane compensation member disposed between the display panel and the polarizing member,
the neutral plane compensation member including a first layer and a second layer,
a thickness of the first layer being in a range of 20 μm to 60 μm, and a modulus of elasticity of the first layer is in a range of $1 \times 10^8$ Pa to $1 \times 10^{10}$ Pa,
a thickness of the second layer is in a range of 20 μm to 60 μm, and a modulus of elasticity of the second layer is in a range of $1 \times 10^4$ Pa to $1 \times 10^6$ Pa, and
the flexible display apparatus is bendable or foldable toward the display panel.

15. The display apparatus of claim 14, wherein an in-plane retardation value of the neutral plane compensation member is 5 nm or less.

16. The display apparatus of claim 14, wherein a retardation value in a thickness direction of the neutral plane compensation member is 40 nm or less.

17. The display apparatus of claim 14, wherein the polarizing member includes a polarizing film layer, a retardation film layer, and a compensation film layer sequentially stacked in a direction toward the neutral plane compensation member.

18. A display apparatus, comprising:
a display panel;
a polarizing member disposed on the display panel; and
a neutral plane compensation member disposed between the display panel and the polarizing member, the neutral plane compensation member including a first layer having a first modulus of elasticity and a second layer having a second modulus of elasticity less than the first modulus of elasticity,
wherein the first layer is in contact with the polarizing member, and the second layer is in contact with the display panel.

19. The display apparatus of claim 18, wherein a thickness of the first layer is a range of 20 μm to 60 μm, and a thickness of the second layer is in a range of 20 μm to 60 μm.

20. The display apparatus of claim 18, wherein the first modulus of elasticity is in a range of $1 \times 10^8$ Pa to $1 \times 10^{10}$ Pa and the second modulus of elasticity is in a range of $1 \times 10^4$ Pa to $1 \times 10^6$ Pa.

* * * * *